（12） United States Patent
Nitta et al.

(10) Patent No.: US 12,324,267 B2
(45) Date of Patent: Jun. 3, 2025

(54) IMAGING DEVICE, ELECTRONIC DEVICE, AND MANUFACTURING METHOD

(71) Applicant: SONY SEMICONDUCTOR SOLUTIONS CORPORATION, Kanagawa (JP)

(72) Inventors: Yosuke Nitta, Kanagawa (JP); Yoshiya Hagimoto, Kanagawa (JP); Nobutoshi Fujii, Kanagawa (JP); Yuichi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 413 days.

(21) Appl. No.: 17/640,086

(22) PCT Filed: Aug. 27, 2020

(86) PCT No.: PCT/JP2020/032282
§ 371 (c)(1),
(2) Date: Mar. 3, 2022

(87) PCT Pub. No.: WO2021/049302
PCT Pub. Date: Mar. 18, 2021

(65) Prior Publication Data
US 2022/0328549 A1 Oct. 13, 2022

(30) Foreign Application Priority Data
Sep. 10, 2019 (JP) .................. 2019-164444

(51) Int. Cl.
*H10F 39/00* (2025.01)
*H04N 25/79* (2023.01)

(52) U.S. Cl.
CPC .......... *H10F 39/809* (2025.01); *H04N 25/79* (2023.01); *H10F 39/811* (2025.01); *H10F 39/8053* (2025.01); *H10F 39/8063* (2025.01)

(58) Field of Classification Search
CPC .............. H01L 27/146–14893; H01L 27/14603–14616; H01L 27/14618;
(Continued)

(56) References Cited

U.S. PATENT DOCUMENTS

2003/0227080 A1  12/2003  Goto
2007/0287265 A1  12/2007  Hatano et al.
(Continued)

FOREIGN PATENT DOCUMENTS

EP   2378547 A1   10/2011
JP   2004-015017   1/2004
(Continued)

OTHER PUBLICATIONS

International Search Report prepared by the Japan Patent Office on Nov. 4, 2020, for International Application No. PCT/JP2020/032282, 5 pgs.

*Primary Examiner* — Evren Seven
*Assistant Examiner* — Cole Leon Lindsey
(74) *Attorney, Agent, or Firm* — SHERIDAN ROSS P.C.

(57) ABSTRACT

The present disclosure relates to an imaging device, an electronic device, and a manufacturing method enabling to reduce a manufacturing cost. There are provided: a first semiconductor element including an imaging element configured to generate a pixel signal; and a second semiconductor element in which a first signal processing circuit and a second signal processing circuit that are configured to process the pixel signal are embedded by an embedded member. The first signal processing circuit has a structure including at least one more layer than the second signal processing circuit. There are further provided: a first wiring line that connects the first semiconductor element and the first signal processing circuit; and a second wiring line that connects the first signal processing circuit and the second
(Continued)

signal processing circuit. The present disclosure can be applied to an imaging device.

20 Claims, 20 Drawing Sheets

(58) Field of Classification Search
CPC .......................... H01L 27/1462–14623; H01L 27/14625–14629; H01L 27/1463; H01L 27/14636; H01L 27/1464; H10F 39/12–199

See application file for complete search history.

(56) References Cited

U.S. PATENT DOCUMENTS

| | | | |
|---|---|---|---|
| 2011/0281138 A1 | 11/2011 | Yoshioka et al. | |
| 2013/0099098 A1 | 4/2013 | Kobayashi | |
| 2016/0293652 A1 | 10/2016 | Kobayashi | |
| 2017/0092622 A1 | 3/2017 | Wu et al. | |
| 2018/0166490 A1* | 6/2018 | Wakiyama | ........ H01L 27/14636 |
| 2020/0021754 A1* | 1/2020 | Borthakur | ......... H01L 27/14689 |

FOREIGN PATENT DOCUMENTS

| | | |
|---|---|---|
| JP | 2004-087661 | 3/2004 |
| JP | 2007-317822 | 12/2007 |
| JP | 2014-099582 | 5/2014 |
| JP | 2015-106671 | 6/2015 |
| JP | 2016-171297 | 9/2016 |
| JP | 2017-195300 | 10/2017 |
| KR | 20170124538 A | 11/2017 |
| TW | 201909440 A | 3/2019 |
| TW | 201924035 A | 6/2019 |
| WO | WO 2010/087336 | 8/2010 |
| WO | WO 2019/021705 | 1/2019 |
| WO | WO 2019/087764 | 5/2019 |
| WO | WO 2019/188131 | 10/2019 |
| WO | WO 2019/198385 | 10/2019 |

* cited by examiner

S33

S34

S35

IMAGING DEVICE, ELECTRONIC DEVICE, AND MANUFACTURING METHOD

CROSS REFERENCE TO RELATED APPLICATIONS

This application is a national stage application under 35 U.S.C. 371 and claims the benefit of PCT Application No. PCT/JP2020/032282, having an international filing date of 27 Aug. 2020, which designated the United States, which PCT application claimed the benefit of Japanese Patent Application No. 2019-164444, filed 10 Sep. 2019, the entire disclosures of each of which are incorporated herein by reference.

TECHNICAL FIELD

The present disclosure relates to an imaging device, an electronic device, and a manufacturing method, and relates to, for example, an imaging device, an electronic device, and a manufacturing method suitable for application to an imaging device including a plurality of chips.

BACKGROUND ART

An imaging device has high image quality in a form of high vision, 4 k×2 k spar high vision, and further a spar slow motion function, resulting in increase of the number of pixels, a high frame rate, and a high gradation.

Since a transmission rate is the number of pixels×frame rate×gradation, for example, in a case of 4 k×2 k=8M pixels, the frame rate of 240 f/s, and 14 bit gradation, 8M×240 f/s×14 bits=26 Gbps is obtained. After signal processing in a subsequent stage of an imaging element, higher speed transmission of 26G×3=78 Gbps is required due to RGB output in color coordination.

When high-speed transmission is performed with a small number of connection terminals, a signal rate per connection terminal increases, difficulty in achieving impedance matching of a high-speed transmission path increases, a clock frequency increases, and a loss also increases, resulting in increase of power consumption.

In order to avoid this, it is preferable to increase the number of connection terminals and divide the transmission to reduce the signal rate. However, when the number of connection terminals is increased, a package of each circuit becomes large due to arrangement of terminals necessary for connection of the imaging element with a signal processing circuit, a memory circuit, and the like in a subsequent stage.

Furthermore, a substrate of electric wiring necessary for the signal processing circuit and the memory circuit in a subsequent stage also requires a finer wiring density in laminated wiring, a wiring path length becomes longer, and accordingly, power consumption increases.

When the package of each circuit becomes large, the substrate itself to be mounted also becomes large, and a configuration itself of the imaging device on which the imaging element is mounted at the end becomes large.

Therefore, as a technique for reducing a size of the configuration of the imaging device, a technique has been proposed in which an imaging element is laminated with circuits such as a signal processing circuit and a memory circuit by wafer on wafer (WoW) that performs bonding of the circuits in a wafer state (see Patent Document 1).

By using the lamination technique using WoW, a semiconductor can be connected by many fine wiring lines, so that a transmission speed per one semiconductor becomes low and power consumption can be suppressed.

CITATION LIST

Patent Document

Patent Document 1: Japanese Patent Application Laid-Open No. 2014-099582

SUMMARY OF THE INVENTION

Problems to be Solved by the Invention

However, in the case of WoW, there is no problem as long as chips of wafers to be laminated have the same size, but the size has to be adjusted to the largest chip size when the sizes of individual chips made to be the wafer are different, and there has been a possibility that manufacturing efficiency of each circuit is deteriorated and a cost is increased.

Furthermore, for a yield of each wafer, a chip defect of each wafer to be laminated also causes chips of other laminated wafers to be treated as defects. Since a yield of wafers of the entire lamination is a product (multiplication) of yields of the individual wafers, there has been a possibility that the yield is deteriorated and a cost is increased.

Furthermore, a technique of connecting chips having different chip sizes by forming small bumps has also been proposed. In this case, since chips of different sizes selected as non-defective products are connected via the bumps, an influence of manufacturing efficiency of each wafer and a yield of each chip is small.

However, since it is difficult to form small bumps and a connection pitch is limited, there has been a possibility that the number of connection terminals cannot be larger than that of WoW. Furthermore, since the connection is performed in a mounting process, there has been a possibility of cost increase caused by a decrease in yield due to the connection, when the number of connection terminals increases.

Furthermore, since the connection in the mounting process has also been individual bonding, time required for the connection becomes long, and there has been a possibility that a process cost increases.

The present disclosure has been made in view of such a situation, and an object thereof is to reduce a manufacturing cost of an imaging device.

Solutions to Problems

A first imaging device according to one aspect of the present technology includes: a first semiconductor element including an imaging element configured to generate a pixel signal; and a second semiconductor element in which a first signal processing circuit and a second signal processing circuit that are configured to process the pixel signal are embedded by an embedded member, in which the first signal processing circuit has a structure including at least one more layer than the second signal processing circuit.

A first electronic device according to one aspect of the present technology includes the first imaging device.

A second imaging device according to one aspect of the present technology includes: a first semiconductor element including an imaging element configured to generate a pixel signal; a second semiconductor element in which a first signal processing circuit and a second signal processing circuit that are configured to process the pixel signal are embedded by an embedded member; and a wiring line that connects the first signal processing circuit and the second signal processing circuit, in which the wiring line connects a terminal provided in a wiring layer of a lowermost layer of the first signal processing circuit and a terminal provided in a wiring layer of a lowermost layer of the second signal processing circuit.

A second electronic device according to one aspect of the present technology includes the second imaging device.

A manufacturing method according to one aspect of the present technology is a manufacturing method for manufacturing an imaging device including: a first semiconductor element including an imaging element configured to generate a pixel signal on a pixel basis; a second semiconductor element in which a first signal processing circuit and a second signal processing circuit that are configured to process the pixel signal are embedded by an embedded member; and a wiring line that connects the first signal processing circuit and the second signal processing circuit. The manufacturing method includes: a step of transferring the first signal processing circuit and the second signal processing circuit to the first semiconductor element; a step of forming a first film on the first signal processing circuit and the second signal processing circuit; a step of exposing a part of a first terminal provided in a wiring layer of a lowermost layer of the first signal processing circuit and a part of a second terminal provided in a wiring layer of a lowermost layer of the second signal processing circuit; and a step of forming the wiring line that connects the first terminal and the second terminal.

In the first imaging device and the first electronic device according to one aspect of the present technology, there are provided: the first semiconductor element including the imaging element configured to generate a pixel signal; and the second semiconductor element in which the first signal processing circuit and the second signal processing circuit that are configured to process the pixel signal are embedded by the embedded member. The first signal processing circuit has a structure including at least one more layer than the second signal processing circuit.

In the second imaging device and the second electronic device according to one aspect of the present technology, there are provided: the first semiconductor element including the imaging element configured to generate a pixel signal; the second semiconductor element in which the first signal processing circuit and the second signal processing circuit that are configured to process the pixel signal are embedded by the embedded member; and the wiring line that connects the first signal processing circuit and the second signal processing circuit. The wiring line connects the terminal provided in the wiring layer of the lowermost layer of the first signal processing circuit and the terminal provided in the wiring layer of the lowermost layer of the second signal processing circuit.

In the manufacturing method according to one aspect of the present technology, the imaging device is manufactured including: the first semiconductor element including the imaging element configured to generate a pixel signal on a pixel basis; the second semiconductor element in which the first signal processing circuit and the second signal processing circuit that are configured to process the pixel signal are embedded by the embedded member; and the wiring line that connects the first signal processing circuit and the second signal processing circuit. The manufacturing method includes: the step of transferring the first signal processing circuit and the second signal processing circuit to the first semiconductor element; the step of forming the first film on the first signal processing circuit and the second signal processing circuit; the step of exposing a part of the first terminal provided in the wiring layer of the lowermost layer of the first signal processing circuit and a part of the second terminal provided in the wiring layer of the lowermost layer of the second signal processing circuit; and the step of forming the wiring line that connects the first terminal and the second terminal.

Note that the imaging device and the electronic device may be independent devices, or may be internal blocks that form one device.

MODE FOR CARRYING OUT THE INVENTION

Hereinafter, an embodiment for implementing the present technology (hereinafter, referred to as an embodiment) will be described.

Here, in describing the present disclosure, wafer on wafer (WoW) disclosed in Patent Document 1 will be described.

Figure 1:
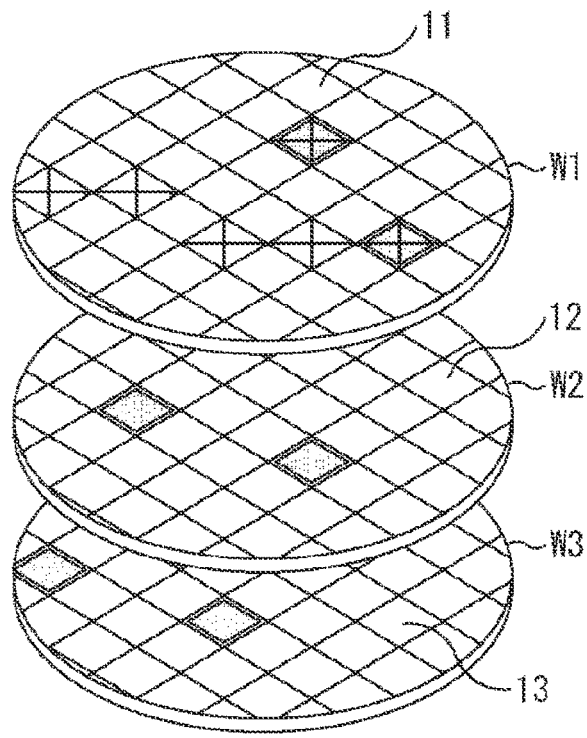
FIG. 1 is a view for explaining a yield.

For example, as illustrated in FIG. 1, WoW is a technology of bonding and laminating an imaging device with a circuit including an IC, such as a signal processing circuit and a memory circuit, in a wafer state.

FIG. 1 schematically represents WoW in which a wafer W1 formed with a plurality of imaging elements 11, a wafer W2 formed with a plurality of memory circuits 12, and a wafer W3 formed with a plurality of logic circuits 13 are bonded and laminated in a finely aligned state.

Figure 2:
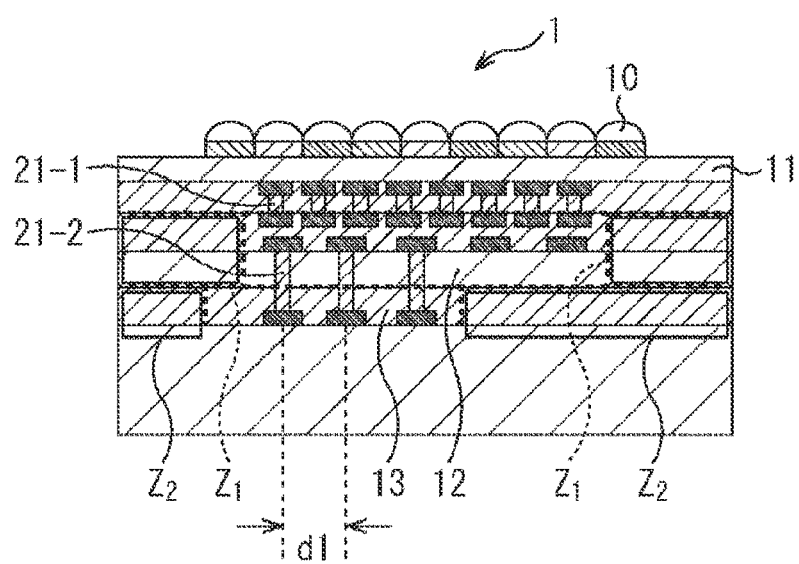
FIG. 2 is a view for explaining a decrease in manufacturing efficiency.

By dicing a configuration laminated in this manner into individual pieces, for example, an imaging device as illustrated in FIG. 2 is formed.

An imaging device 1 of FIG. 2 is configured by laminating an on-chip lens, an on-chip color filter 10, the imaging element 11, the memory circuit 12, the logic circuit 13, and a supporting substrate 14 in this order from the top.

Here, by applying the WoW technology, a wiring line 21-1 electrically connecting the imaging element 11 and the memory circuit 12 and a wiring line 21-2 electrically connecting the memory circuit 12 and the logic circuit 13 can be connected at a fine pitch.

As a result, since the number of wiring lines can be increased, a transmission speed in each signal line can be reduced, and power saving can be achieved.

However, since areas required for each of the imaging element 11, the memory circuit 12, and the logic circuit 13 to be laminated are different, a space Z1 in which neither a circuit nor a wiring line is formed is generated on the left and right in the figure of the memory circuit 12 having an area smaller than that of the largest imaging element 11.

Furthermore, a space Z2 in which neither a circuit nor a wiring line is formed is generated on the left and right in the figure of the logic circuit having an area smaller than that of the memory circuit 12.

That is, the spaces Z1 and Z2 are generated due to the fact that the areas required for the imaging element 11, the memory circuit 12, and the logic circuit 13 are different from each other, and are caused as a result of laminating with, as a reference, the imaging element 11 that requires the largest area, in FIG. 2.

This configuration reduces manufacturing efficiency of the imaging device 1, and as a result, a manufacturing cost is increased.

Furthermore, in FIG. 1, among the imaging elements 11, the memory circuits 12, and the logic circuits 13 formed in the respective wafers W1 to W3, a defective configuration is represented by filling squares. That is, FIG. 1 illustrates that two defects occur in each of the wafers W1 to W3.

As illustrated in FIG. 1, defects occurring in the imaging elements 11, the memory circuits 12, and the logic circuits 13 formed in the respective wafers W1 to W3 do not necessarily occur at the same position. Therefore, as illustrated in FIG. 1, in the imaging devices 1 formed by lamination, six defects with cross marks on the wafer W1 of the imaging element 11 occur.

As a result, in the six defective imaging devices 1, the imaging elements 11, the memory circuits 12, and the logic circuits 13 are treated as having six defects each although at least two components among three components of the imaging element 11, the memory circuit 12, and the logic circuit 13 are not defective. Therefore, the number of yields is to be six each, which is obtained by integrating the number of wafers, while the number of yields may be originally two for each component.

As a result, the yield of the imaging device 1 is reduced, and the manufacturing cost is increased.

Figure 3:
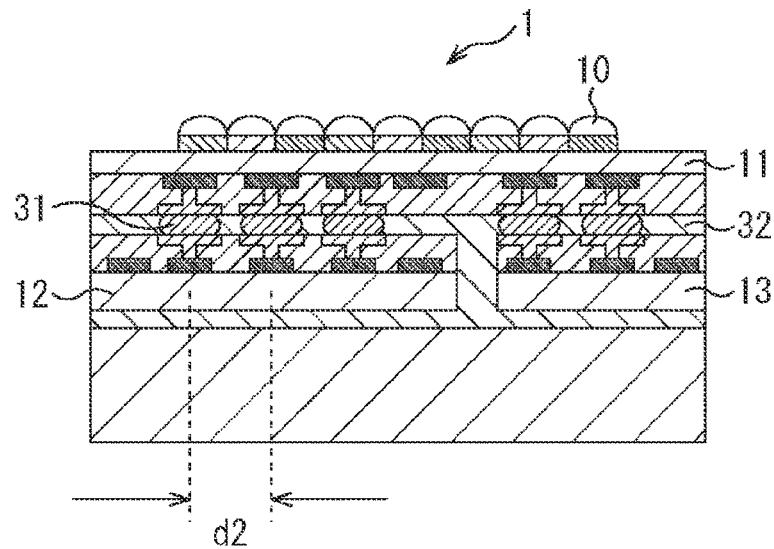
FIG. 3 is a view for explaining connection using bumps.

Furthermore, as illustrated in FIG. 3, it is conceivable to dice into individual pieces the imaging element 11, the memory circuit 12, and the logic circuit 13 having different chip sizes, selectively arrange only non-defective products, and connect by forming a small bump.

In the imaging device 1 of FIG. 3, an on-chip lens, the on-chip color filter 10, and the imaging element 11 are laminated from the top, the memory circuit 12 and the logic circuit 13 are laminated on the same layer therebelow, and the supporting substrate 14 is provided therebelow and laminated. Furthermore, the imaging element 11, and the memory circuit 12 and the logic circuit 13 arranged in the same layer are electrically connected via small bumps 31.

In the imaging device 1 of FIG. 3, chips of different sizes selected as non-defective products are connected via the bumps 31, and an influence of a manufacturing efficiency difference of individual wafers and a yield of each chip is reduced.

However, it is difficult to form the small bumps 31, and there is a limit to decrease a connection pitch d2 as illustrated in FIG. 3, so that the connection pitch d2 cannot be made smaller than a connection pitch d1 in FIG. 2 in a case where WoW is used.

For this reason, the imaging device 1 of FIG. 3 laminated using the bumps cannot have a larger number of connection terminals than that of the imaging device 1 of FIG. 2 laminated by WoW. Furthermore, in a case of connection using bumps as in the imaging device 1 of FIG. 3, when the number of connection terminals increases, reduction in a yield related to bonding occurs since bonding is performed in a mounting process, and a cost increases. Moreover, since the connection of the bumps in the mounting process is also an individual operation, time of each process is long, and a process cost also increases.

As described above, the imaging element of the present disclosure is to reduce the cost related to manufacturing from the viewpoint of the manufacturing efficiency, the mounting cost, and the process cost.

<About Lamination of Wafers>

Figure 4:
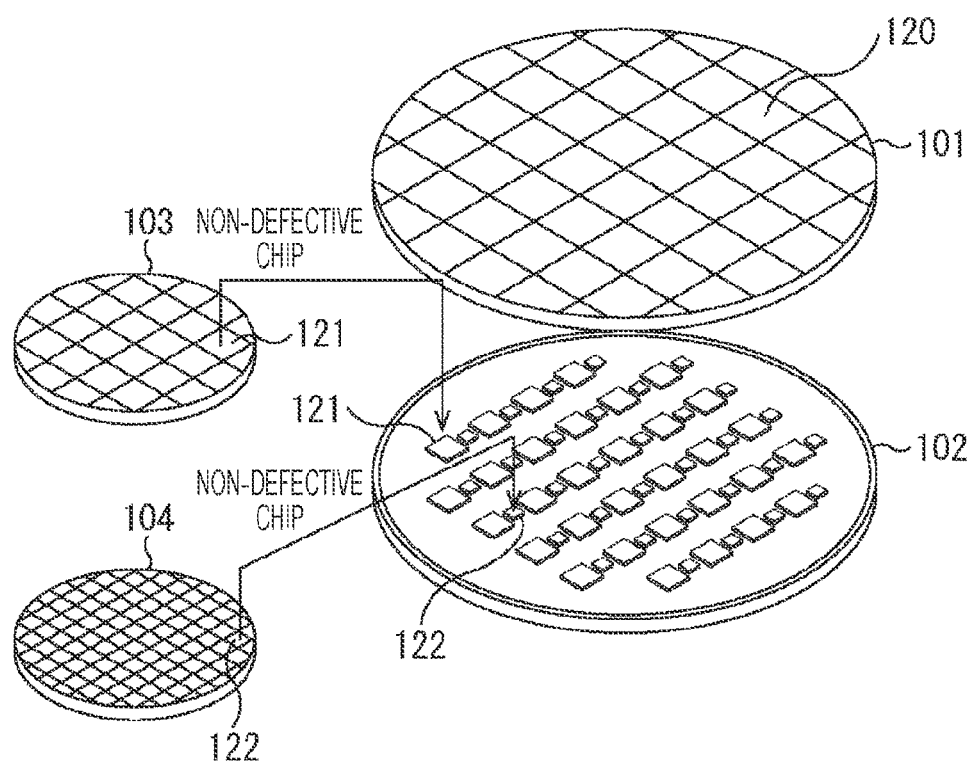
FIG. 4 is a view for explaining an outline of a manufacturing method of an imaging device.

FIG. 4 is a view for explaining a structure in which a plurality of wafers is laminated by the WoW technology that is applied when an imaging device of the present disclosure is manufactured.

In manufacturing the imaging device of the present disclosure, two wafers are laminated in a state where wiring lines are precisely aligned, while the two wafers include: a wafer 101 on which a plurality of imaging elements (complementary metal oxide semiconductor (CMOS) image sensors or charge coupled devices (CCDs)) 120 is formed; and the supporting substrate 102 on which the memory circuit 122 and the logic circuit 121 are rearranged.

In the wafer 101, the plurality of imaging elements 120 is formed by a semiconductor process.

On the supporting substrate 102, a plurality of memory circuits 122 is rearranged, which is formed on a wafer 103 by a semiconductor process, diced into individual pieces, then electrically inspected individually, and confirmed to be non-defective chips.

On the supporting substrate 102, a plurality of logic circuits 121 is rearranged, which is formed on a wafer 104 by a semiconductor process, diced into individual pieces, then electrically inspected individually, and confirmed to be non-defective chips.

<Configuration Example of Imaging Device>

FIG. 4 is a view for explaining a structure in which a plurality of wafers is laminated by a combination of a chip on wafer (CoW) technology and the WoW technology that are applied when the imaging device of the present disclosure is manufactured. By laminating the plurality of wafers by the CoW technology and the WoW technology as illustrated in FIG. 4, and then dicing into individual pieces, an imaging device 111 (FIG. 5) of the present disclosure is formed.

Figure 5:
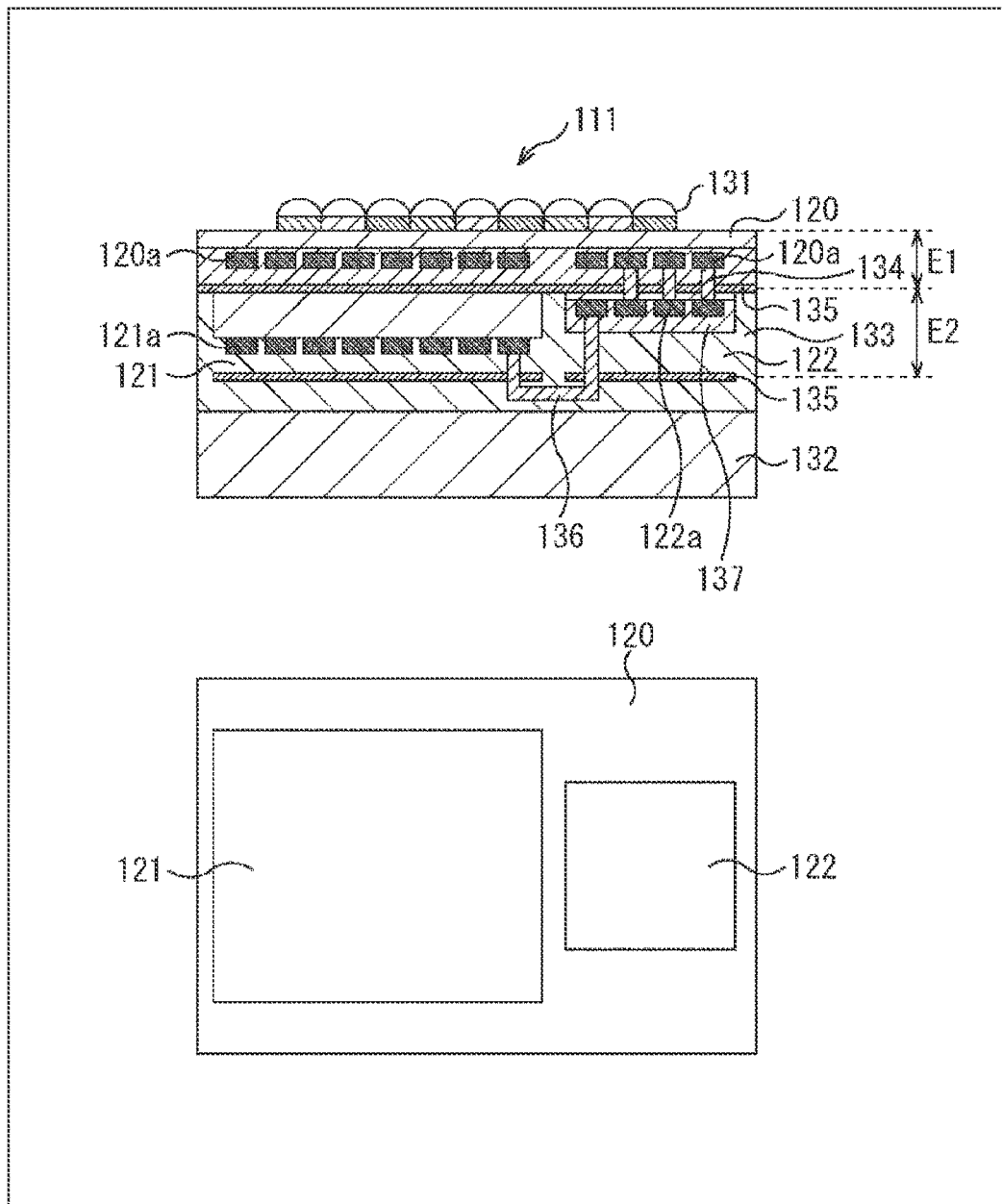
FIG. 5 is a view for explaining a configuration example of the imaging device.

The imaging device of the present disclosure has, for example, a configuration as illustrated in FIG. 5. Note that, in FIG. 5, an upper part is a side cross-sectional view, and a lower part is a view illustrating a horizontal arrangement relationship of the imaging element 120, and the logic circuit 121 and the memory circuit 122 when viewed from an upper surface.

In the imaging device 111 in the upper part of FIG. 5, from the top in the figure, an on-chip lens, the on-chip color filter 131, and the imaging element 120 are laminated, and the logic circuit 121 and the memory circuit 122 are arranged and laminated on the left and right sides in the same layer therebelow, and a supporting substrate 132 is formed therebelow. That is, as illustrated in the upper part of FIG. 5, the imaging device 111 of FIG. 5 includes: a semiconductor element layer E1 including the imaging element 120 formed by the wafer 101; and a semiconductor element layer E2 including the logic circuit 121 and the memory circuit 122 that are formed on the supporting substrate 102.

Among terminals 120a of the imaging element 120, a terminal 120a on the memory circuit 122 is electrically connected to a terminal 121a of the memory circuit 122 by a wiring line 134 connected by CuCu connection.

Although not illustrated in FIG. 5, a configuration may be adopted in which a terminal 120a on the logic circuit 121 among the terminals 120a of the imaging element 120 may be configured to be connected to a terminal 122a of the logic circuit 121 by CuCu connection.

In the example illustrated in the upper part of FIG. 5, an example has been shown in which the imaging element 120 and the logic circuit 121 are not directly connected, but the logic circuit 121 and the imaging element 120 are indirectly connected by configuring such that the logic circuit 121 and the memory circuit 122 are connected by a wiring line 136, and the memory circuit 122 and the imaging element 120 are connected.

In the semiconductor element layer E2 in which the logic circuit 121 and the memory circuit 122 are formed, a space around the logic circuit 121 and the memory circuit 122 is in a state of being filled with an oxide film 133. As a result, in the semiconductor element layer E2, the logic circuit 121 and the memory circuit 122 are in a state of being embedded in the oxide film 133.

Furthermore, at a boundary between the semiconductor element layer E1 on which the imaging element 120 is formed and the semiconductor element layer E2 on which the logic circuit 121 and the memory circuit 122 are formed, an oxide film bonding layer 135 is formed and bonded by oxide film bonding. Moreover, the semiconductor element layer E2 of the logic circuit 121 and the memory circuit 122 is bonded with the supporting substrate 132 by forming the oxide film bonding layer 135 by oxide film bonding.

The terminal 121a of the logic circuit 121 is in a state of being embedded in the oxide film 133. The terminal 122a of the memory circuit 122 is embedded in a bulking layer 137. While this bulking layer 137 will be described later, since the bulking layer 137 is provided, the terminal 122a of the memory circuit 122 is configured to be located at a position close to the terminal 120a of the imaging element 120 as a connection destination.

In a case where the logic circuit 121 and the memory circuit 122 are compared with each other, the memory circuit 122 has at least one more layer than that of the logic circuit 121. Here, a case is illustrated in which the bulking layer 137 is provided as the at least one more layer. The layer corresponding to the bulking layer 137 may be a multilayer.

The bulking layer 137 can also be provided as an oxide film. In a case where the bulking layer 137 is provided as an oxide film, it can include the same material as the oxide film 133 laminated on the bulking layer 137. In this case, the bulking layer 137 and the oxide film 133 can be regarded as one layer. In a case of such an embodiment, this one layer is configured to be thick. The "being configured to be thick" means that a thickness is larger than that of the oxide film 133 of the circuit without the bulking layer 137, for example, the logic circuit 121.

In other words, when a predetermined layer A of the logic circuit 121 is compared with a layer B of the memory circuit 122 corresponding to the predetermined layer A of the logic circuit 121, the layer B is configured to be thicker than the layer A. The layer B includes the bulking layer 137, and the layer B is configured to be thicker than the layer A, by including the bulking layer 137.

Furthermore, as illustrated in the lower part of FIG. 5, when viewed from the upper surface, the logic circuit 121 and the memory circuit 122 are arranged so as to be included in a range where the imaging element 120 of an uppermost layer exists. With such an arrangement, in the layers of the logic circuit 121 and the memory circuit 122, a free space other than the logic circuit 121 and the memory circuit 122 is reduced, which makes it possible to improve manufacturing efficiency.

On the supporting substrate 102 in FIG. 4, the logic circuit 121 and the memory circuit 122 are precisely adjusted and rearranged so as to be arranged within the range of the imaging element 120 as viewed from the individual upper surfaces, when individual imaging devices 111 are diced into individual pieces.

<Manufacturing Method of Imaging Device in FIG. 5>

Next, a manufacturing method of the imaging device 111 in FIG. 5 will be described with reference to FIGS. 6 to 11.

Figure 6:
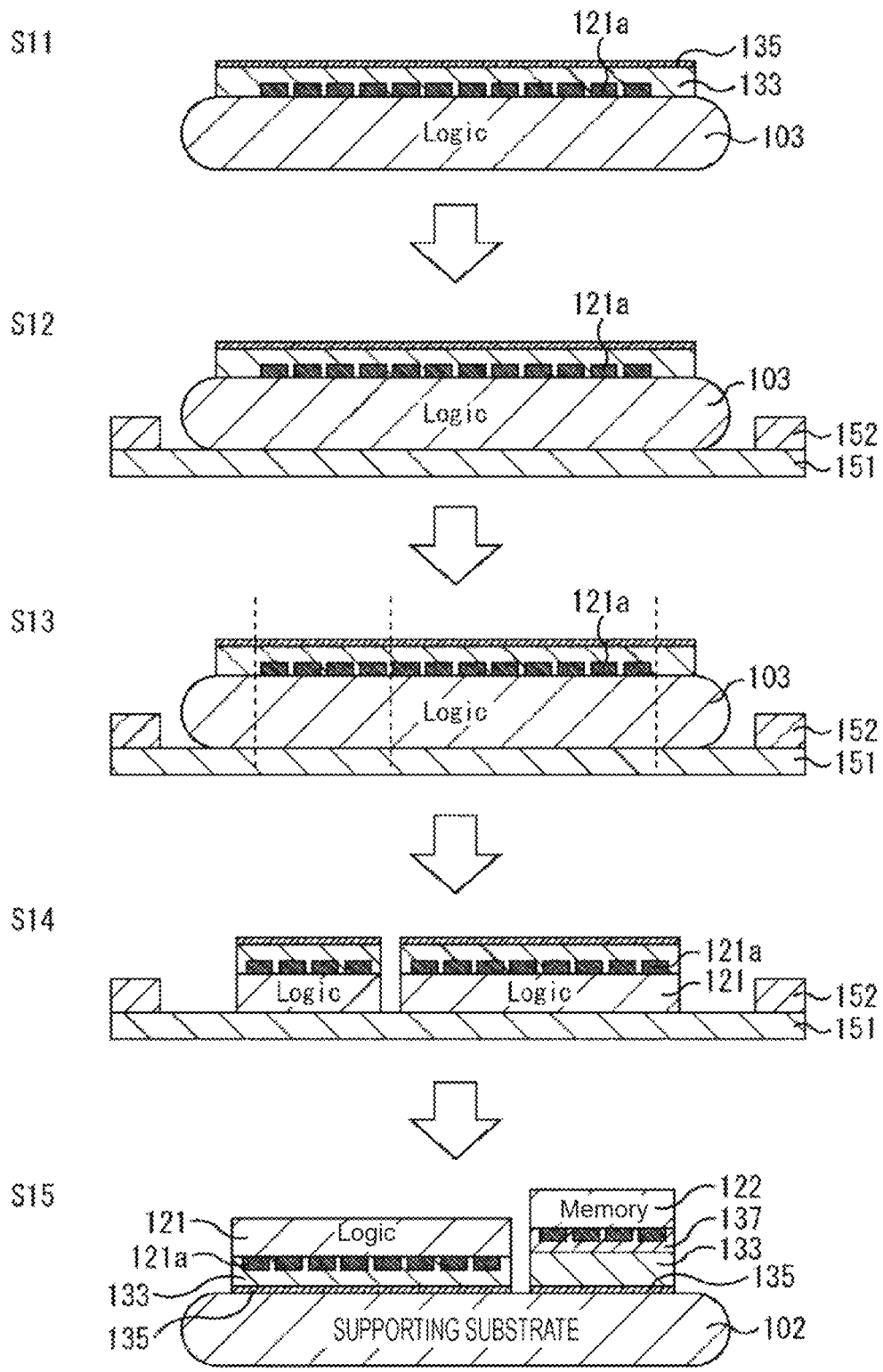
FIG. 6 is a view for explaining a manufacturing method of the imaging device.

In steps S11 to S14 in FIG. 6, the logic circuit 121 is manufactured. In step S11, the wafer 103 on which the logic circuits 121 are formed is prepared. In each logic circuit 121 of the wafer 103, the terminal 121a is formed on the logic circuit 121, the oxide film 133 is formed so as to cover the terminal 121a, and the oxide film bonding layer 135 is further formed.

In step S12, a dicing tape 151 is attached to the wafer 103. Furthermore, the wafer 103 to which the dicing tape 151 is attached is fixed to a ring frame 152 (also referred to as a dicing frame or the like).

In step S13, the wafer 103 is diced to cut out the logic circuit 121. In step S14, a gap is formed between the cut logic circuits 121 by stretching the wafer 103. From such a state, the individual logic circuits 121 are peeled off from the dicing tape 151 and transferred to the supporting substrate 102 (step S15).

Note that, as illustrated in FIG. 6, the logic circuits 121 having different sizes can be formed on one wafer 103 and diced into individual pieces.

Figure 7:
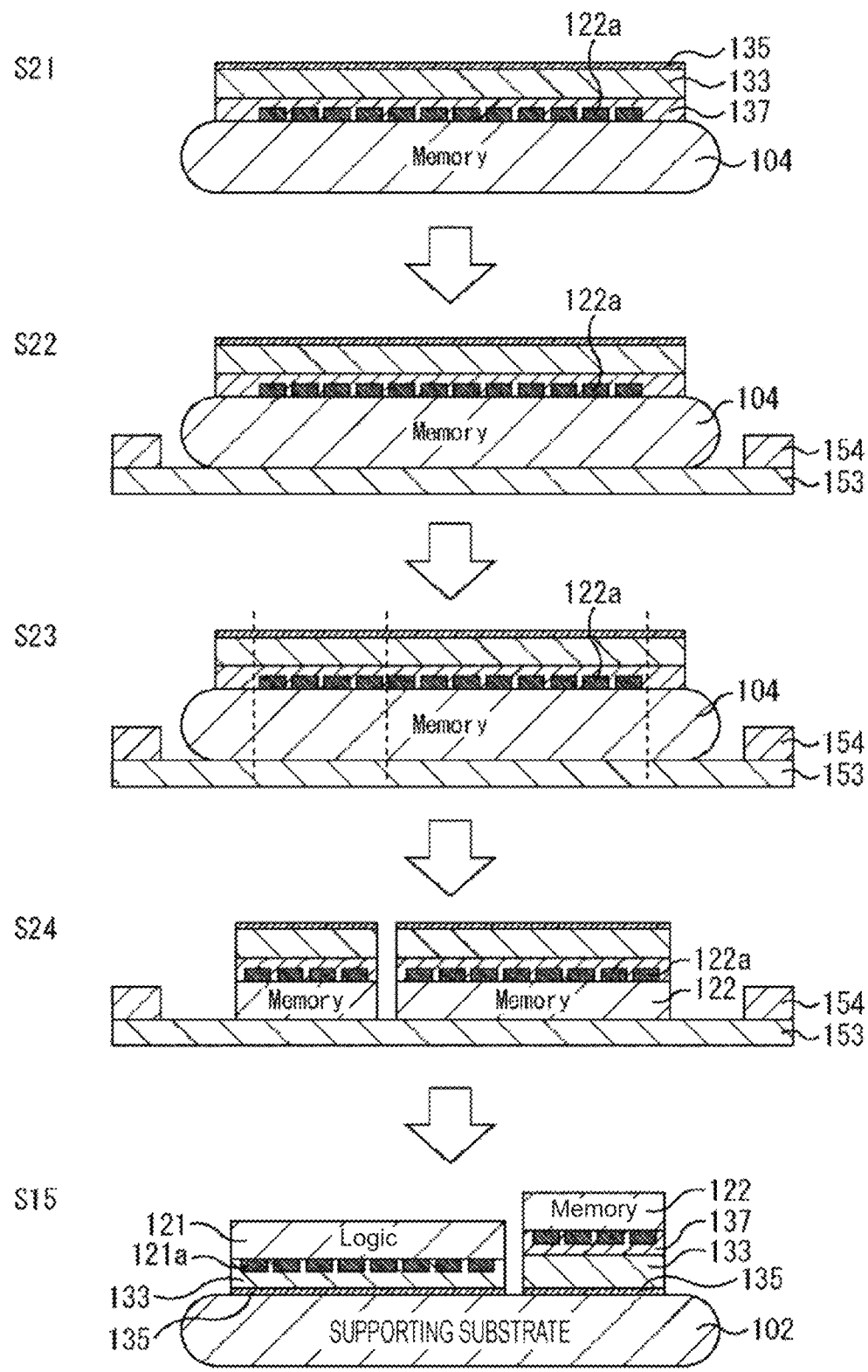
FIG. 7 is a view for explaining the manufacturing method of the imaging device.

In steps S21 to S24 in FIG. 7, the memory circuit 122 is manufactured. In step S21, the wafer 104 on which the memory circuits 122 are formed is prepared. In each memory circuit 122 of the wafer 104, the terminal 122*a* is formed on the memory circuit 122, and the bulking layer 137 is formed so as to cover the terminal 122*a*. Moreover, the oxide film 133 is formed on the bulking layer 137, and the oxide film bonding layer 135 is further formed.

As compared to the logic circuit 121, the memory circuit 122 has a configuration in which one layer of the bulking layer 137 is added. The bulking layer 137 is provided to facilitate rewiring of a circuit to be rewired. The bulking layer 137 can include an oxide film.

In a case where (the wafer 103 of) the logic circuit 121 shown in step S11 of FIG. 6 is compared with (the wafer 104 of) the memory circuit 122 shown in step S21 of FIG. 7, there is a difference in that the memory circuit 122 is formed with the bulking layer 137 and the logic circuit 121 is not formed with the bulking layer 137.

In step S22 of FIG. 7, a dicing tape 153 is attached to the wafer 104. Furthermore, the wafer 104 to which the dicing tape 153 is attached is fixed to a ring frame 154.

In step S23, the wafer 104 is diced to cut out the memory circuit 122. In step S24, a gap is formed between the cut memory circuits 122 by stretching the wafer 104. From such a state, the individual memory circuits 122 are peeled off from the dicing tape 153 and transferred to the supporting substrate 102 (step S15).

As described above, in step S15, the separately manufactured logic circuit 121 and memory circuit 122 are transferred to the supporting substrate 102.

Note that, as illustrated in FIG. 7, the memory circuits 122 having different sizes can be formed on one wafer 103 and diced into individual pieces.

Figure 8:
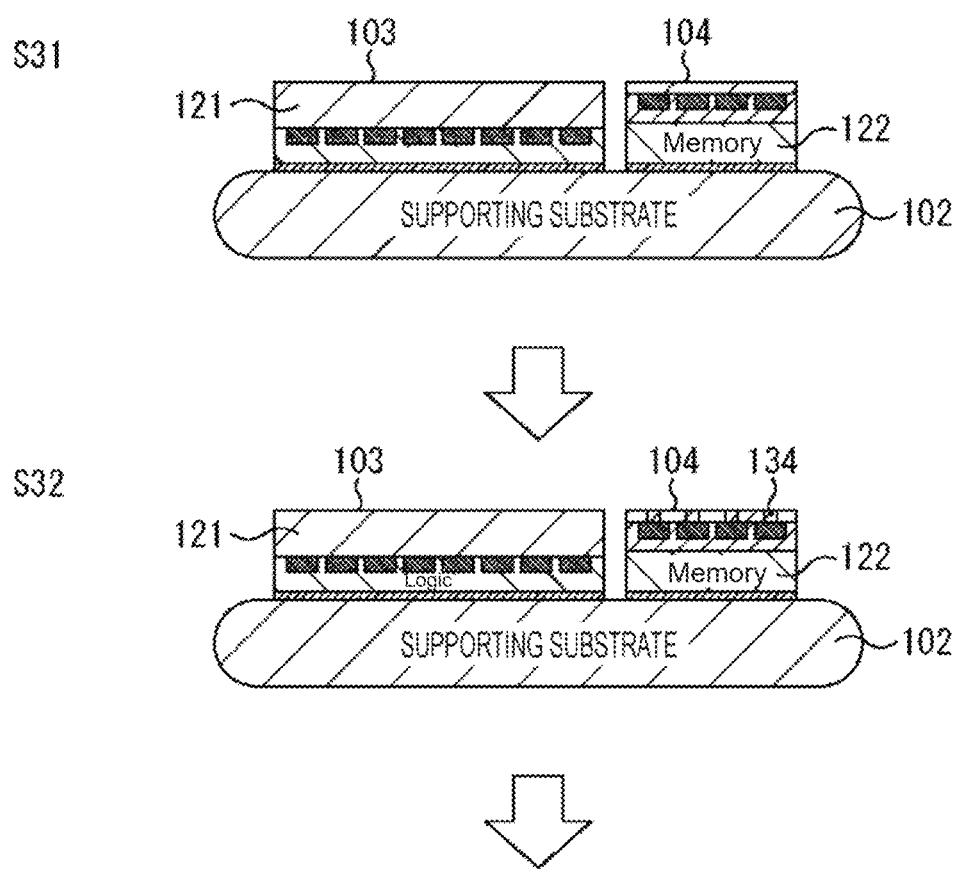
FIG. 8 is a view for explaining the manufacturing method of the imaging device.
Figure 9:
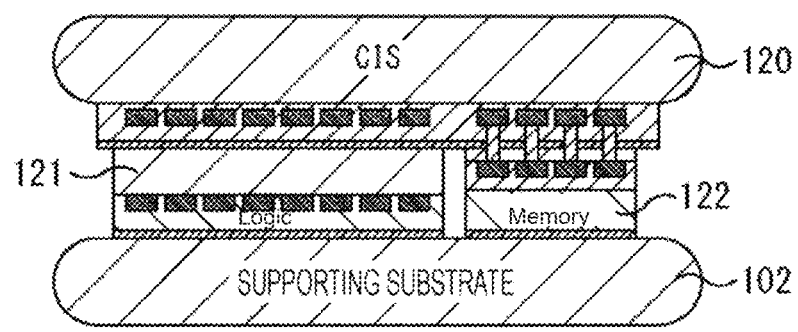
FIG. 9 is a view for explaining the manufacturing method of the imaging device.
Figure 9:
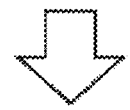
Figure 9:
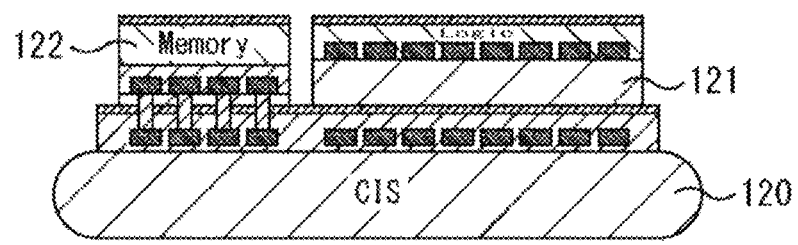
Figure 9:
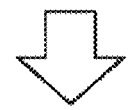
Figure 9:
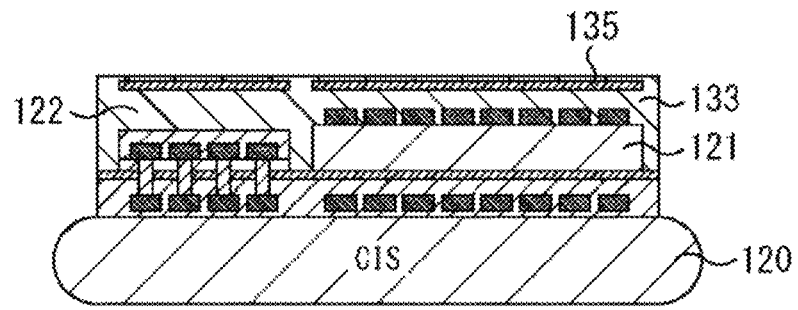
Figure 10:
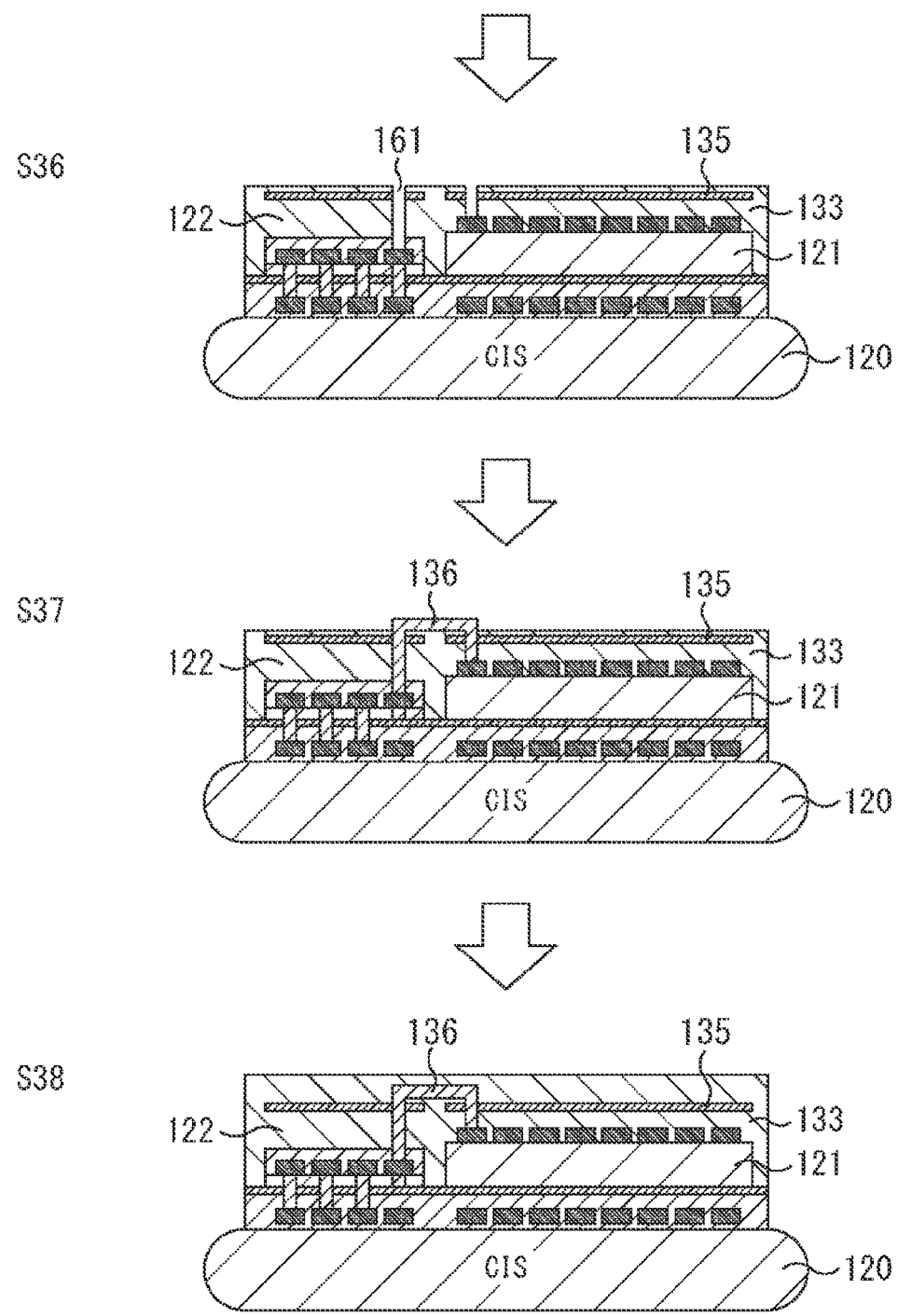
FIG. 10 is a view for explaining the manufacturing method of the imaging device.
Figure 11:
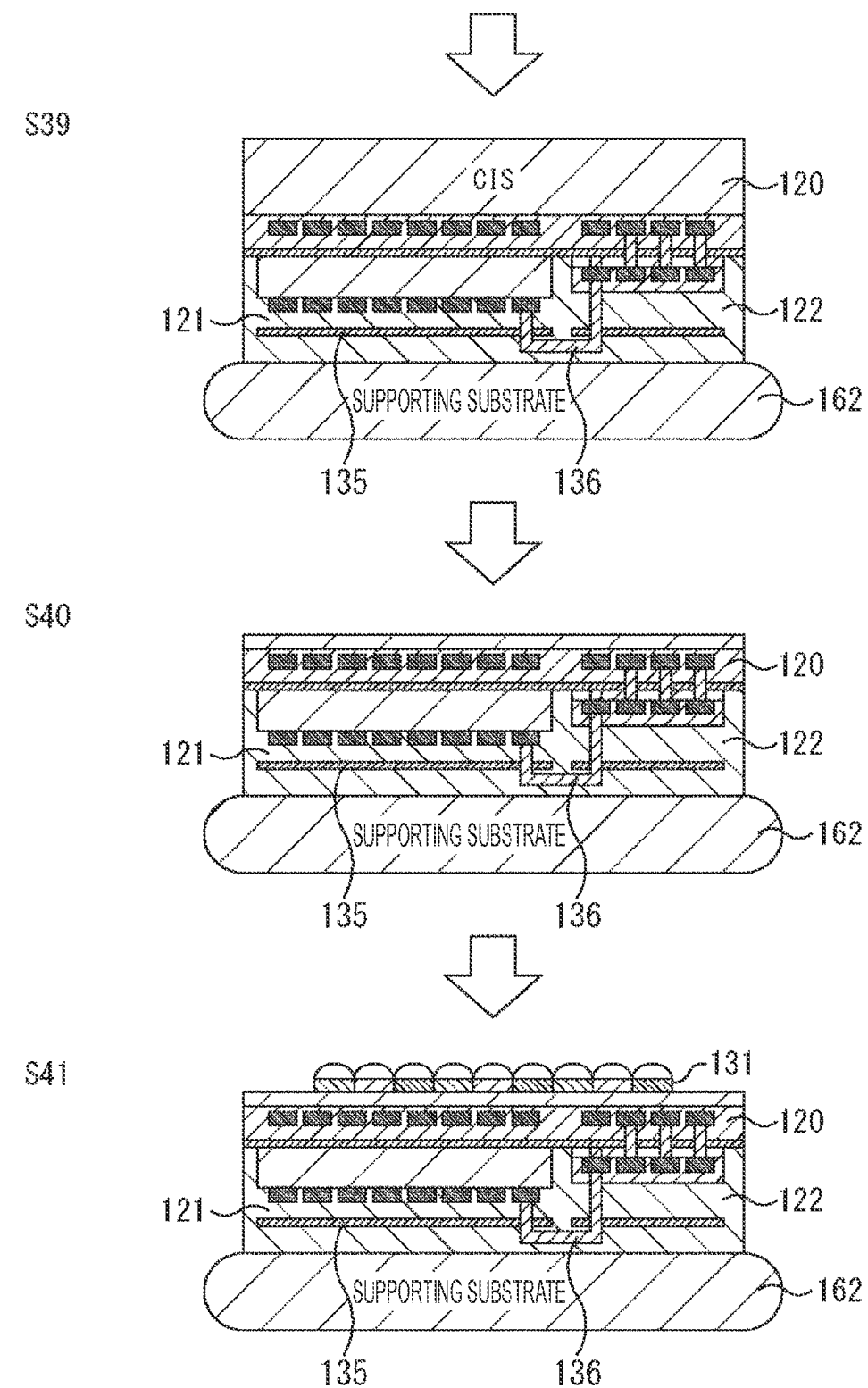
FIG. 11 is a view for explaining the manufacturing method of the imaging device.

When the manufacturing is advanced to a state where the logic circuit 121 and the memory circuit 122 are placed on the supporting substrate 102 in step S15 (FIG. 6 or 7), thinning is performed in step S31 (FIG. 8).

The logic circuit 121 and the memory circuit 122 before thinning have different heights as shown at step S15. In other words, the memory circuit 122 is formed higher than the logic circuit 121 by an amount corresponding to the formation of the bulking layer 137.

In step S31, silicon layers (the wafer 103 and 104, hereinafter referred to as silicon layers 103 and 104 as appropriate) of an upper surface portion of the logic circuit 121 and the memory circuit 122 in the figure is thinned to a height that does not affect characteristics of the device.

In step S32, rewiring on a back surface side is performed. Here, a case where rewiring is performed on the memory circuit 122 and is not performed on the logic circuit 121 will be described as an example. The rewiring is formed by opening a portion where the wiring line 134 is desired to be formed on the silicon layer 104 of the memory circuit 122 and filling the portion with a conductive material such as copper.

In step S33 (FIG. 9), alignment is performed so that the wiring line 134 from the terminal 122*a* of the memory circuit 122 in the supporting substrate 102 and the wiring line 134 from the terminal 120*a* of the imaging element 120 in the wafer 101 at are positions appropriately facing each other.

Then, the wafer 101 and the supporting substrate 102 are bonded by WoW such that the wiring line 134 from the terminal 122*a* of the memory circuit 122 in the supporting substrate 102 is connected to the wiring line 134 from the terminal 120*a* of the imaging element 120 in the wafer 101 by CuCu bonding. This processing brings a state where each memory circuit 122 of the supporting substrate 102 is electrically connected to each imaging element 120 of the wafer 101.

In step S34, the supporting substrate 102 is peeled off. For example, the supporting substrate 102 is removed by being de-bonded or etched.

In step S35, embedding is performed. As shown at step S35, the oxide film 133 functioning as an insulating film is formed. At this time, a surface of the oxide film 133 is flattened at a height corresponding to the logic circuit 121 and the memory circuit 122.

In step S36 (FIG. 10), a through silicon via (TSV) 161 is formed. The TSV 161 is formed in a portion for forming the wiring line 136 connecting the logic circuit 121 and the memory circuit 122.

In step S37, the wiring line 136 is formed by filling, for example, copper (Cu), tungsten (W), polysilicon, or the like in the TSV 161 and in a rewiring portion connecting the TSV 161 in a horizontal direction.

In step S38, the oxide film 133 functioning as an insulating film is formed so as to also cover the wiring line 136, and a chip including the arranged memory circuit 122 and logic circuit 121 is embedded. At this time, a surface of the oxide film 133 is flattened at a height corresponding to the logic circuit 121 and the memory circuit 122.

In step S39 (FIG. 11), a supporting substrate 162 is attached onto the oxide film 133 formed in step S38. In step S40, thinning is performed on the silicon layer (the layer corresponding to the wafer 101), which is an upper layer of the imaging element 120 in the figure.

In step S41, the on-chip lens and the on-chip color filter 131 are provided on the imaging element 120, and dicing into individual pieces is performed to complete the imaging device 111.

With such a configuration, the number of connection terminals can be increased because the connection between circuits of the imaging element 120 and the memory circuit 122 can be connection by forming the terminals at a wiring density of fine wiring by the semiconductor lithography technique similarly to WoW, and a signal processing speed in each wiring line can be reduced, enabling reduction of power consumption.

Furthermore, also in a case where circuits of the imaging element 120 and the logic circuit 121 are formed to be connected to each other, the number of connection terminals can be increased because the connection can be made by forming the terminals at a wiring density of fine wiring, and a signal processing speed in each wiring line can be reduced, enabling reduction of power consumption.

Furthermore, since only non-defective chips are connected in the logic circuit 121 and the memory circuit 122, a defect of each wafer, which is a disadvantage of WoW, is reduced, and thus an occurrence of the yield loss can be reduced.

Moreover, as illustrated in the lower part of FIG. 5, unlike WoW, since each of the memory circuit 122 and the logic circuit to be connected can be arranged in an independent island shape by making a size as small as possible regardless of a chip size of the imaging element 120, it is possible to improve manufacturing efficiency of the logic circuit 121 and the memory circuit 122 to be connected.

As a result, since the imaging element 120 requires a minimum necessary pixel size for reacting to optical light, a process of fine wiring is not necessarily required for the manufacturing process of the imaging element 120, so that the process cost can be reduced. Furthermore, in the manufacturing process of the logic circuit 121, power consumption can be reduced by using the most advanced fine wiring process. Moreover, it is possible to improve manufacturing efficiency of the logic circuit 121 and the memory circuit 122. As a result, the cost related to the manufacturing of the imaging device 111 can be reduced.

Furthermore, due to a structure in which chips can be realigned in a wafer and bonded, lamination can be made in one chip even in a case of different types of processes in which it is difficult to produce, in the same wafer, an analog circuit such as a power supply IC and a clock, the logic circuit 121, and a configuration made by a completely different process, or even when there is a difference in wafer size.

Furthermore, an example in which the logic circuit 121 and the memory circuit 122 are used as circuits connected to the imaging element 120 has been described above. However, a circuit other than the logic circuit 121 and the memory circuit 122 may be used as long as it is a signal processing circuit required for an operation of the imaging element 120, such as a circuit related to control of the imaging element 120 or a circuit related to processing of a captured pixel signal. The signal processing circuit required for the operation of the imaging element 120 may be, for example, a power supply circuit, an image signal compression circuit, a clock circuit, an optical communication conversion circuit, or the like.

<About Bulking Layer>

In the example described above, an example has been shown in which the memory circuit 122 is provided with the bulking layer 137, and the logic circuit 121 is not provided with the bulking layer 137. The configuration of the imaging device 111 illustrated in the upper part of FIG. 5 will be referred to again. The terminal 122*a* of the memory circuit 122 and the terminal 120*a* of the imaging element 120 are connected by the wiring line 134. The terminal 121*a* of the logic circuit 121 and the terminal 120*a* of the imaging element 120 are not connected.

The terminal 122*a* of the memory circuit 122 is provided on a side closer to the terminal 120*a* than the terminal 121*a* of the logic circuit 121. That is, the terminal 122*a* connected to the terminal 120*a* is provided on a side closer to the terminal 120*a* than the terminal 122*a* not connected. By providing the memory circuit 122 with the bulking layer 137, the terminal 122*a* of the memory circuit 122 can be provided at a position close to the terminal 120*a* of the imaging element 120.

In other words, by providing the memory circuit 122 with the bulking layer 137, a thickness of the silicon layer 104 of the memory circuit 122 can be formed thin, and the terminal 122*a* of the memory circuit 122 can be provided at a position close to the terminal 120*a* of the imaging element 120.

Figure 12:
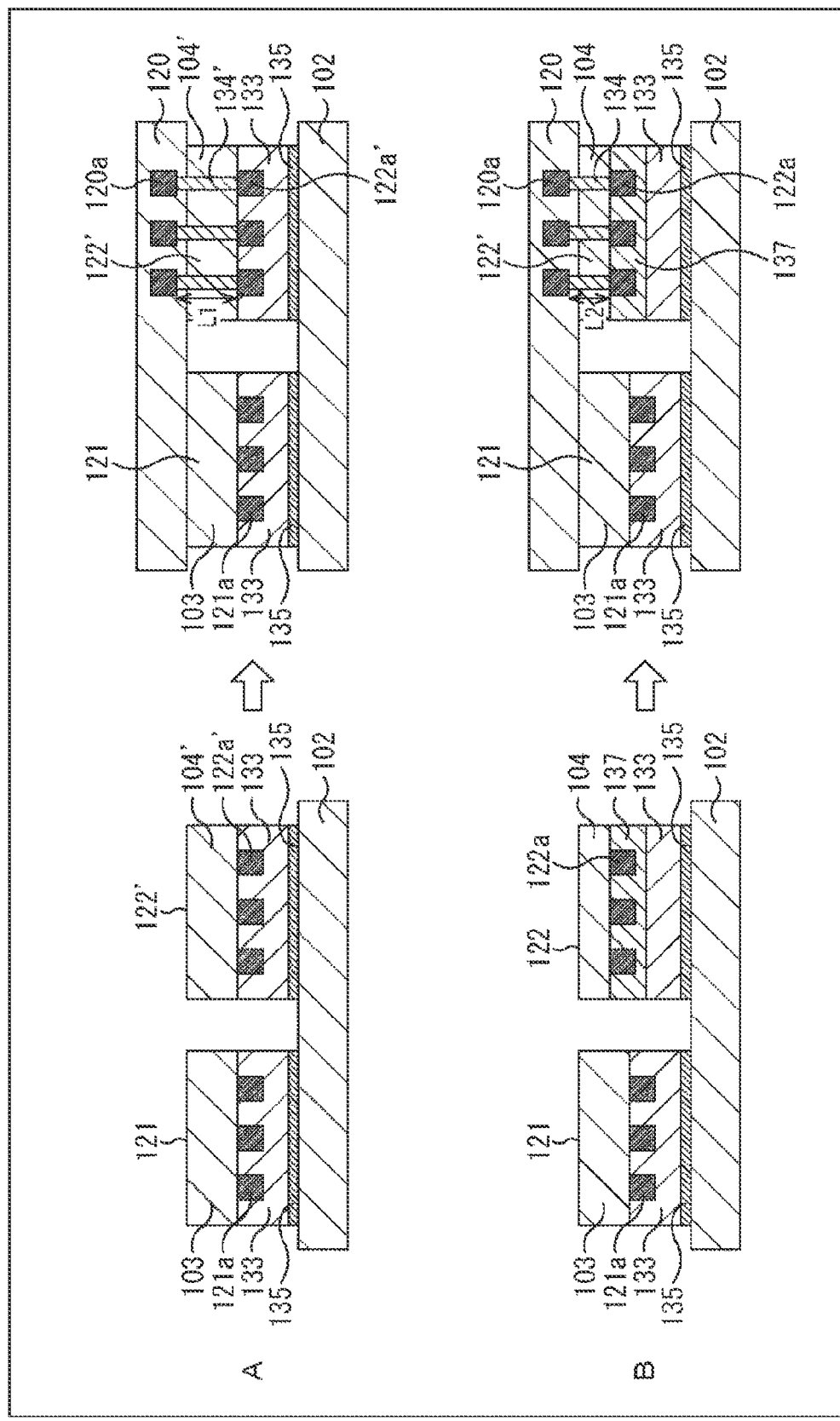
FIG. 12 is a view for explaining easiness of rewiring.

This will be described with reference to FIG. 12. A of FIG. 12 is a view for explaining a case where the bulking layer 137 is not provided, in other words, a case where the imaging device 111 is manufactured in a conventional manufacturing step. B of FIG. 12 is a view for explaining a case where the bulking layer 137 is provided, in other words, a case where the imaging device 111 is manufactured in the above-described manufacturing step.

As illustrated in a left figure in A of FIG. 12, the logic circuit 121 and a memory circuit 122' have a configuration in which the oxide film bonding layer 135, the oxide film 133, and the silicon layer 103 (silicon layer 104') are laminated on the supporting substrate 102. Note that, in order to distinguish from the memory circuit 122 to which the present technology is applied, the memory circuit 122 not provided with the bulking layer 137 is described as the memory circuit 122' by adding a dash.

As illustrated in a right figure in A of FIG. 12, the imaging element 120 is further laminated from a state illustrated in the left figure in A of FIG. 12. Furthermore, the terminal 120*a* of the imaging element 120 and a terminal 122*a*' of the memory circuit 122' are connected by a wiring line 134'. A length of the wiring line 134' is defined as a length L1.

In a case where the bulking layer 137 is provided, as illustrated in a left figure of B of FIG. 12, the logic circuit 121 has a configuration in which the oxide film bonding layer 135, the oxide film 133, and the silicon layer 103 are laminated on the supporting substrate 102.

Furthermore, the memory circuit 122 has a configuration in which the oxide film bonding layer 135, the oxide film 133, the bulking layer 137, and the silicon layer 103 are laminated on the supporting substrate 102.

As illustrated in a right figure in B of FIG. 12, the imaging element 120 is further laminated from a state illustrated in the left figure in B of FIG. 12. Furthermore, the terminal 120*a* of the imaging element 120 and the terminal 122*a* of the memory circuit 122 are connected by the wiring line 134. A length of the wiring line 134 is defined as a length L2.

As illustrated in the left figure in B of FIG. 12, thicknesses of the silicon layer 103 and the silicon layer 104 are different, and the silicon layer 104 is formed thinner than the silicon layer 103 by a thickness of the bulking layer 137.

The length L1 and the length L2 are a length of the wiring line 134 (134'), but this length depends on the thickness of the silicon layer 104. Therefore, when the thickness of the silicon layer 104 is thin, the length of the wiring line 134 becomes short. That is, in the case of the example illustrated in FIG. 12, it is clear that the length L1>the length L2 is satisfied.

In general, it is easier to form a short wiring line than to form a long wiring line. For example, in a case of forming a via in order to form the wiring line 134, forming the via shallower can be performed easier in a shorter time than in a case of forming the via deeper.

According to the present technology, since the thickness of the silicon layer 104 of the memory circuit 122 can be formed thin, it is easy to form the wiring line 134 on the terminal 122*a* of the memory circuit 122 in step S32 (FIG. 8).

As described above, a configuration can be adopted in which a circuit (chip) requiring rewiring is provided with the bulking layer 137 to facilitate rewiring.

In the above-described example, an example in which the logic circuit 121 and the memory circuit 122 are used as circuits connected to the imaging element 120 has been described. However, a circuit other than the logic circuit 121 and the memory circuit 122 may be used as long as it is a signal processing circuit required for an operation of the imaging element 120, such as a circuit related to control of the imaging element 120 or a circuit related to processing of a captured pixel signal.

Furthermore, in the above-described example, a case where the memory circuit 122 is provided with the bulking layer 137 has been described as an example, but a configuration is also possible in which the logic circuit 121 is provided with the bulking layer 137. Furthermore, it is also possible to have a configuration in which the bulking layer 137 is provided in both the logic circuit 121 and the memory circuit 122. Moreover, in a case of a configuration in which both the logic circuit 121 and the memory circuit 122 are provided with the bulking layer 137, a thickness of the bulking layer 137 can be made the same or different.

The present technology can also be applied to a device having a configuration in which a plurality of circuits (chips) is mounted on one chip. That is, the plurality of chips can be formed as a chip provided with a bulking layer or a chip not provided with a bulking layer, and can be mounted on one chip. Furthermore, in a case where a plurality of chips provided with the bulking layer is mounted on one chip, a thickness of the bulking layer can be made different for each chip.

<About Wiring Line to Connect Circuits to Each Other>

For example, in the imaging device 111 illustrated in the upper part of FIG. 5, the logic circuit 121 and the memory circuit 122 are connected by the wiring line 136. As illustrated in the upper part of FIG. 5, the wiring line 136 is provided to connect the terminal 121a in the logic circuit 121 and the terminal 122a of the memory circuit 122. This wiring line 136 may have a shape as illustrated in FIG. 13.

Figure 13:
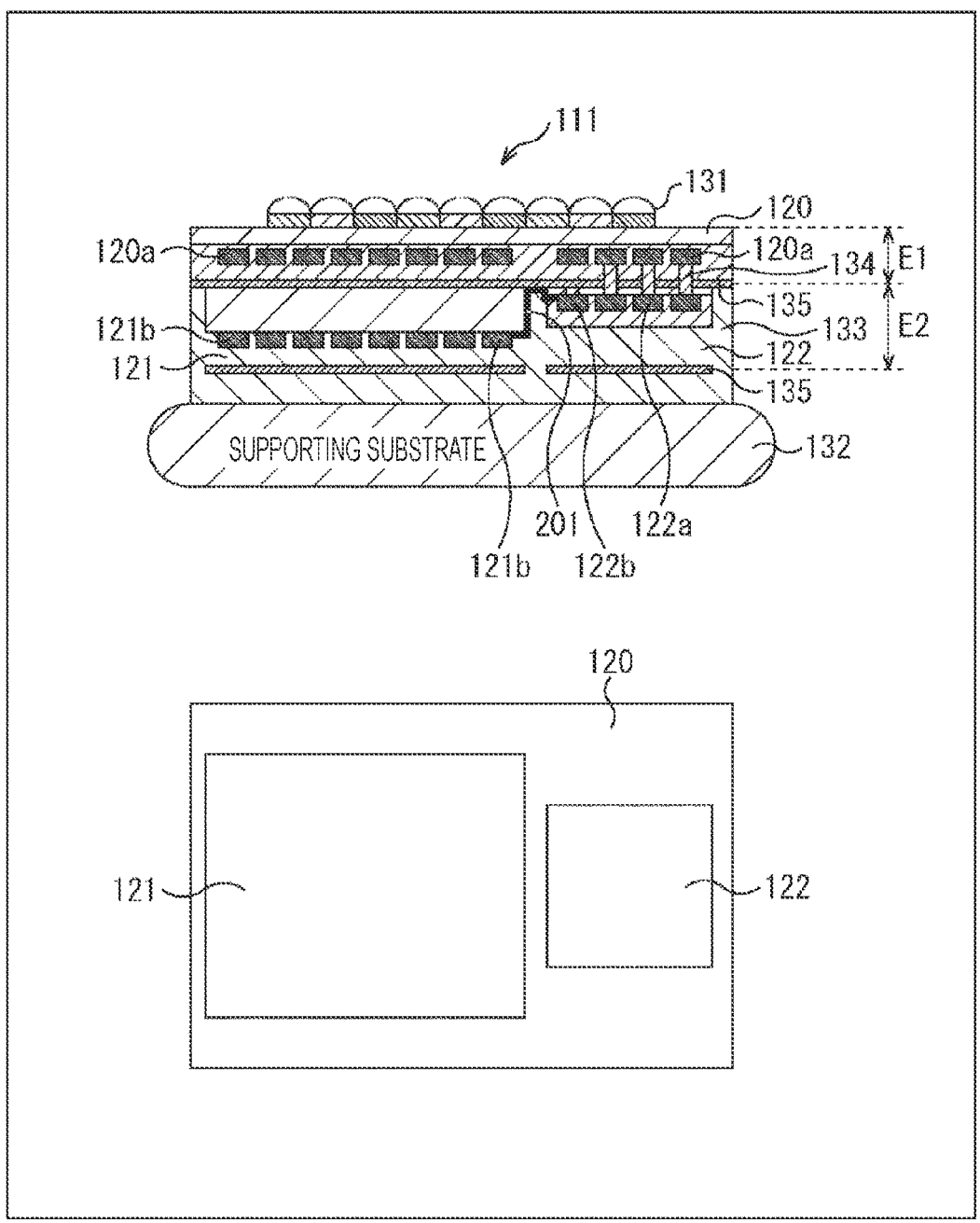
FIG. 13 is a view for explaining another configuration example of the imaging device.

In the imaging device 111 illustrated in FIG. 13, a terminal 121b of the logic circuit 121 and a terminal 122b of the memory circuit 122 are connected by a wiring line 201. The terminal 121b is a terminal on a side closer to the memory circuit 122 among the terminals 121a of the logic circuit 121. The terminal 122b is a terminal on a side closer to the logic circuit 121 among the terminals 122a of the memory circuit 122.

The terminal 121b and the terminal 122b are provided as terminals to which the wiring line 201 is connected. Note that, here, a case has been exemplified where the terminal 121b close to the memory circuit 122 side among the terminals 121a provided in the logic circuit 121 is the terminal connected to the wiring line 201, but a terminal 121b to connect to the wiring line 201 may be newly provided. Similarly, here, a case has been exemplified where the terminal 122b close to the logic circuit 121 side among the terminals 122a provided in the memory circuit 122 is the terminal connected to the wiring line 201, but a terminal 122b to connect to the wiring line 201 may be newly provided.

The wiring line 201 is formed along a side surface of the silicon layer 103 of the logic circuit 121, the oxide film bonding layer 135 provided on the imaging element 120 side, and a side surface of the silicon layer 104 of the memory circuit 122, and formed to connect the terminal 121b and the terminal 122b.

Figure 14:
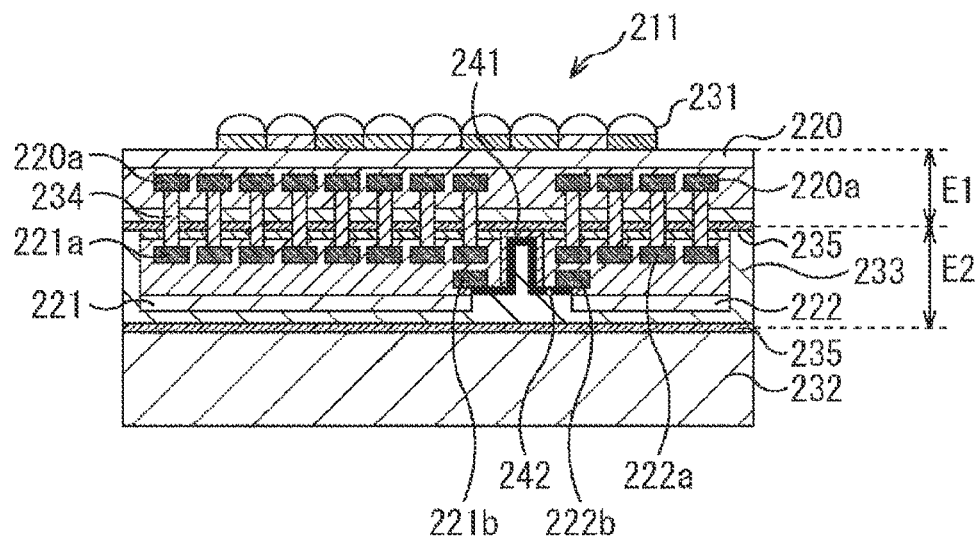
FIG. 14 is a view for explaining another configuration example of the imaging device.

Such a wiring line can also be applied to an imaging device 211 having a configuration as illustrated in FIG. 14. Comparing the imaging device 211 illustrated in FIG. 14 with the imaging device 111 illustrated in the upper part of FIG. 5, there is a difference in that a memory circuit 222 of the imaging device 211 is not provided with the bulking layer 137, in the configuration. Furthermore, a logic circuit 221 and the memory circuit 222 of the imaging device 211 are provided with a terminal 221b and a terminal 222b, respectively, and the logic circuit 221 and the memory circuit 222 are connected by the terminal 221b and the terminal 222b being connected by a wiring line 242, in the configuration.

Note that, in the imaging device 211 illustrated in FIG. 14, an example in which the logic circuit 221 and an imaging element 220 are connected by a wiring line 234 has been illustrated. However, similarly to the imaging device 111 illustrated in FIG. 5, a configuration may be adopted in which the logic circuit 221 and the imaging element 220 are not connected by the wiring line 234. That is, the present technology can be applied regardless of whether or not the logic circuit 221 and the imaging element 220 are directly connected.

The configuration of the imaging device 211 illustrated in FIG. 14 will be further described. In the imaging device 211 in FIG. 14, from the top in the figure, an on-chip lens, an on-chip color filter 231, and the imaging element 220 are laminated, the memory circuit 222 and the logic circuit 221 are arranged and laminated on the left and right in the same layer therebelow, and a supporting substrate 232 is formed therebelow. That is, as illustrated in FIG. 14, the imaging device 211 in FIG. 14 includes: a semiconductor element layer E1 including the imaging element 220 formed by the wafer 101; and a semiconductor element layer E2 including the memory circuit 222 and the logic circuit 221 that are formed on the supporting substrate 102.

Among terminals 220a of the imaging element 220, a terminal 220a on the logic circuit 221 is electrically connected to a terminal 211a of the logic circuit 221 by the wiring line 234 connected by CuCu connection.

Furthermore, among the terminals 220a of the imaging element 220, a terminal 220a on the memory circuit 222 is electrically connected to a terminal 222a of the memory circuit 222 by the wiring line 234 connected by CuCu connection.

In the semiconductor element layer E2 in which the logic circuit 221 and the memory circuit 222 are formed, a space around the memory circuit 222 and the logic circuit 221 is in a state of being filled with an oxide film 233. As a result, in the semiconductor element layer E2, the memory circuit 222 and the logic circuit 221 are in a state of being embedded in the oxide film 233.

Furthermore, at a boundary between the semiconductor element layer E1 on which the imaging element 220 is formed and the semiconductor element layer E2 on which the memory circuit 222 and the logic circuit 221 are formed, an oxide film bonding layer 235 is formed and bonded by oxide film bonding. Moreover, the semiconductor element layer E2 of the memory circuit 222 and the logic circuit 221 is bonded with the supporting substrate 232 by forming the oxide film bonding layer 235 by oxide film bonding.

Furthermore, the logic circuit 221 and the memory circuit 222 are connected by the wiring line 242. The wiring line 242 is provided to connect the terminal 221b of the logic circuit 221 and the terminal 222b of the memory circuit 222. To manufacture as described later, a protective film 241 is provided on a part of the wiring line 242.

The terminal 221b and the terminal 222b are provided separately from the terminal 221a and the terminal 222a, respectively, and are provided as terminals to connect the logic circuit 221 and the memory circuit 222.

The wiring line 242 is provided from the terminal 221b along a side surface of the logic circuit 221, the oxide film bonding layer 235, and a side surface of the memory circuit 222, and is connected to the terminal 222b. Furthermore, the protective film 241 is provided between the wiring line 242, and the side surface of the logic circuit 221, the oxide film bonding layer 235, and the side surface of the memory circuit 222.

<About Manufacture of Imaging Device 211>

Figure 15:
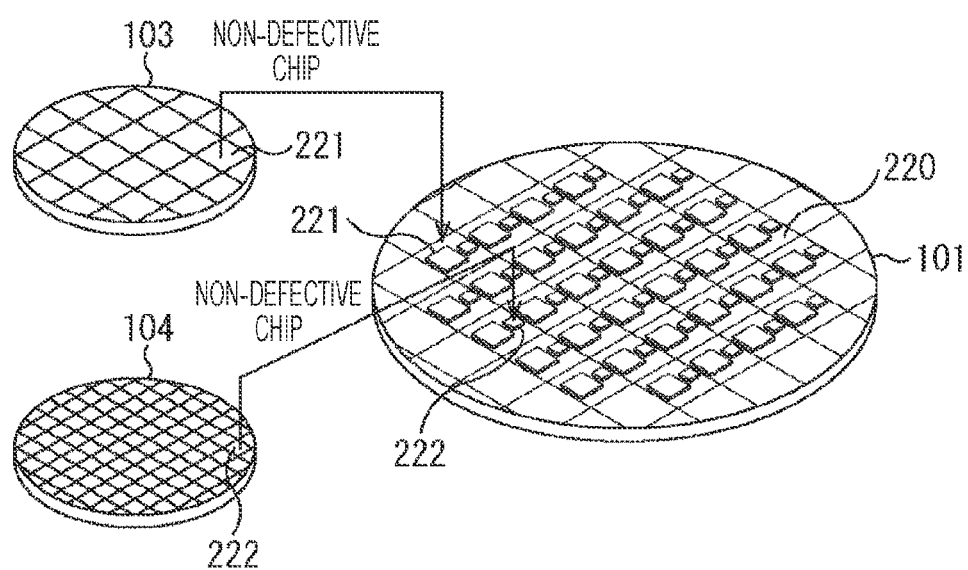
FIG. 15 is a view for explaining an outline of a manufacturing method of the imaging device.

FIG. 15 is a view for explaining a manufacturing method of an imaging device in which the logic circuit 221 and the memory circuit 222 that have been diced into individual pieces and confirmed to be non-defective chips are directly formed in the imaging element 220 on the wafer 101.

In the wafer 101, a plurality of imaging elements 220 is formed by a semiconductor process. Furthermore, on the imaging element 220 formed on the wafer 101, there are selected and rearranged a plurality of logic circuits 221, which is formed on the wafer 103 by a semiconductor process, diced into individual pieces, then electrically inspected individually, and confirmed to be non-defective chips; and a plurality of memory circuits 222, which is formed on the wafer 104 by a semiconductor process, diced into individual pieces, then electrically inspected individually, and confirmed to be non-defective chips.

That is, since the logic circuit 221 and the memory circuit 222 that are confirmed to be non-defective chips are rearranged on the imaging element 220, here, both the logic circuit 221 and the memory circuit 222 are configured to be smaller than the imaging element 220.

<Manufacturing Method of Imaging Device 211>

Figure 16:
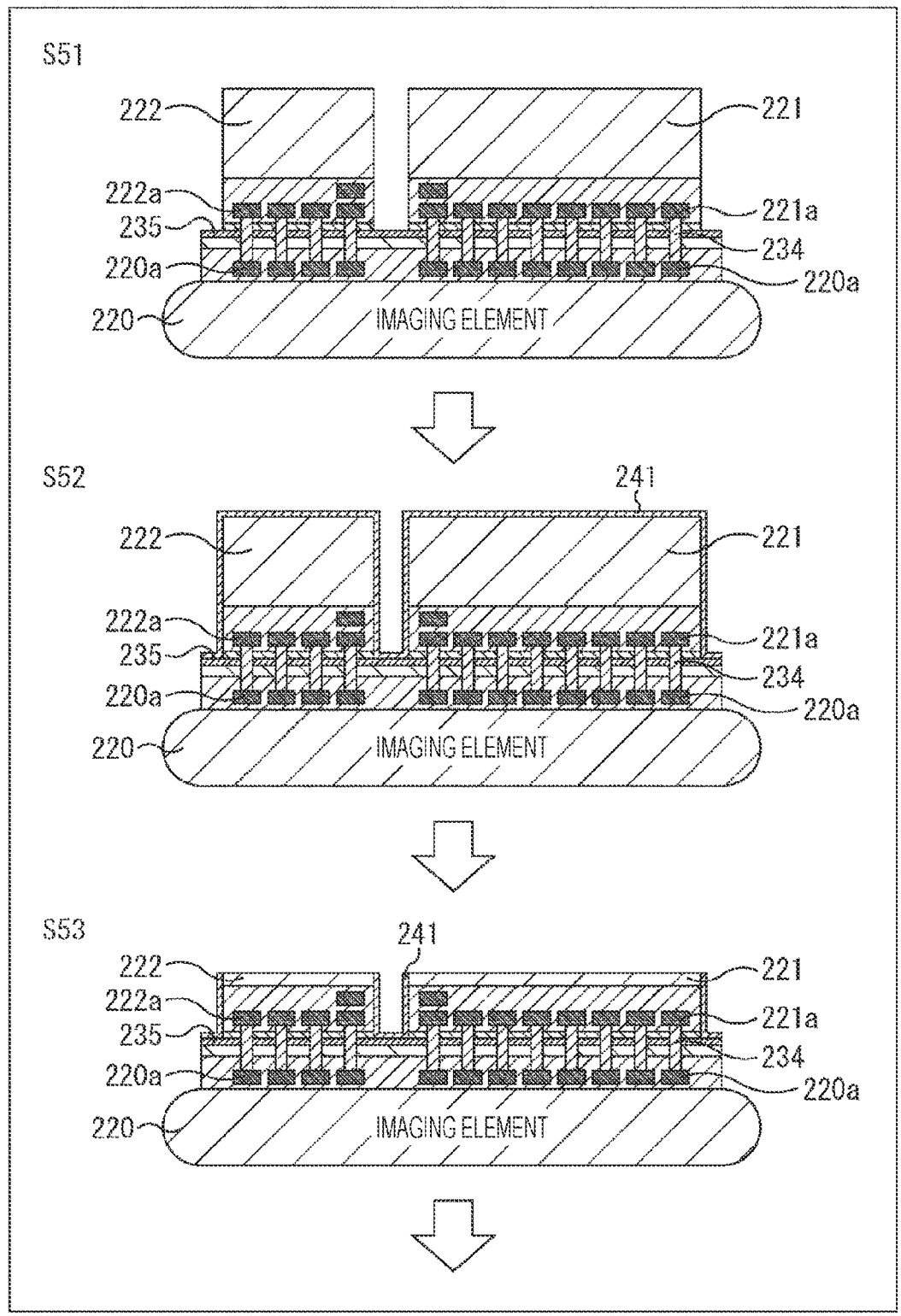
FIG. 16 is a view for explaining the manufacturing method of the imaging device.
Figure 17:
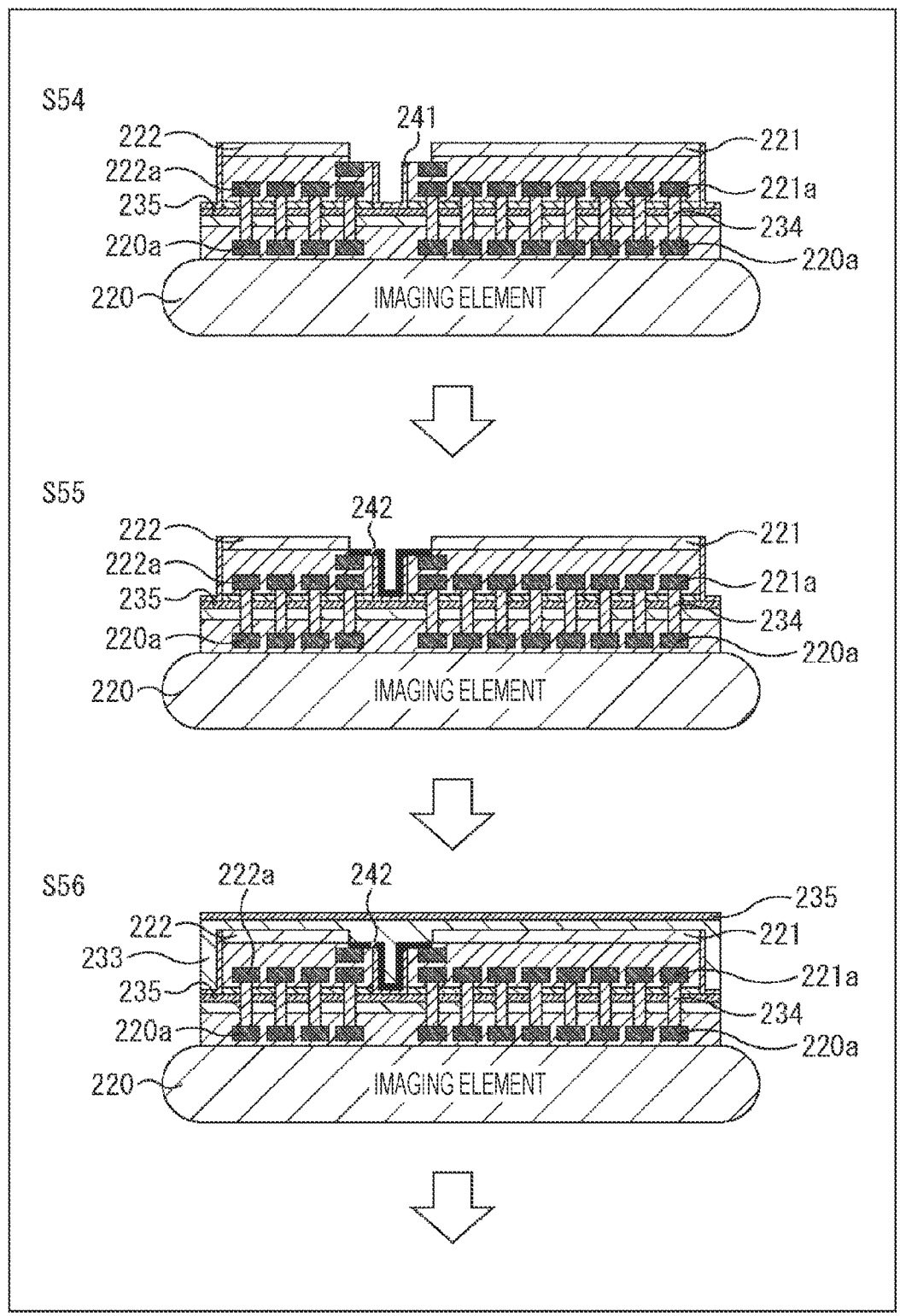
FIG. 17 is a view for explaining the manufacturing method of the imaging device.
Figure 18:
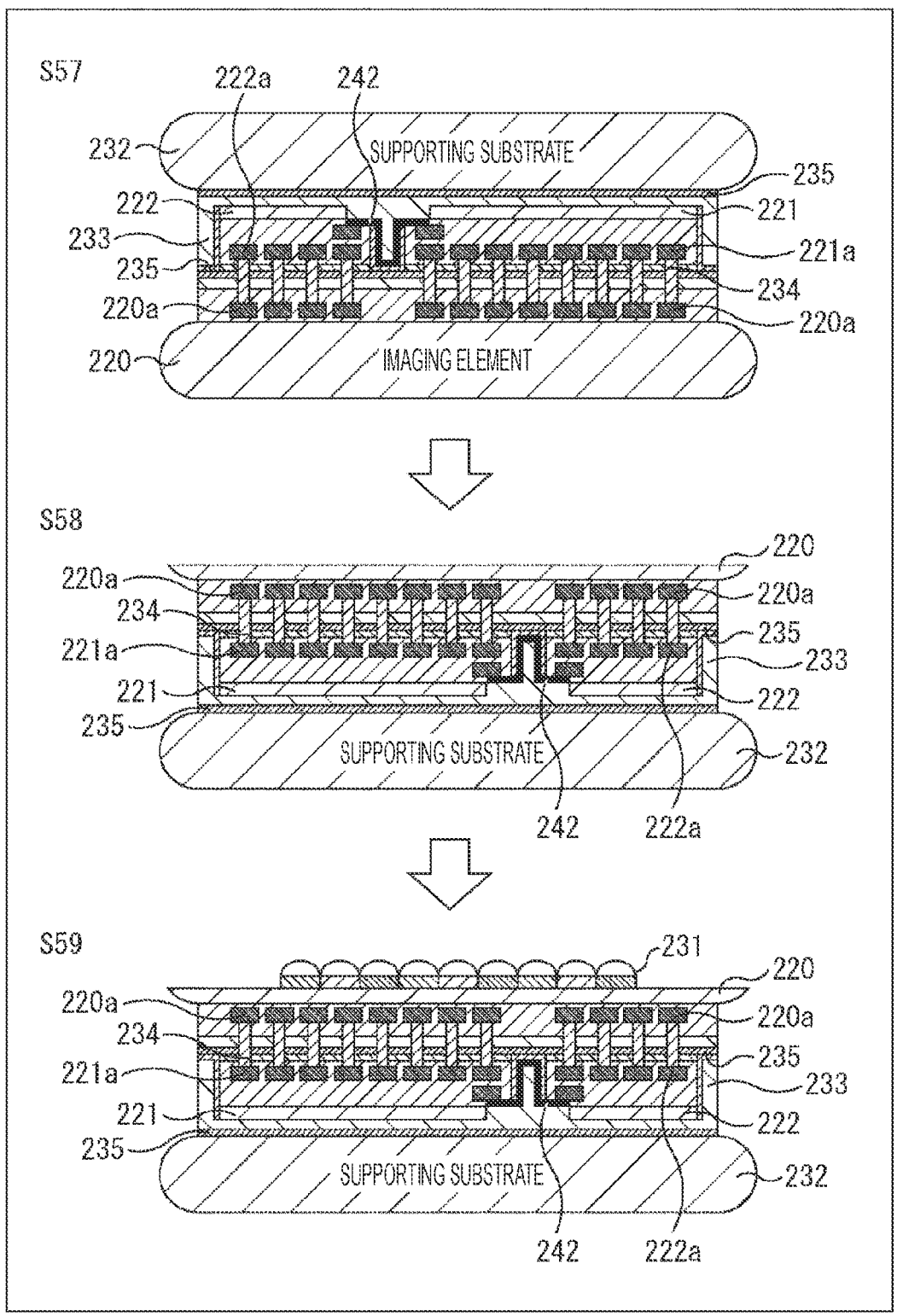
FIG. 18 is a view for explaining the manufacturing method of the imaging device.

Next, a case of directly transferring the logic circuit 221 and the memory circuit 222 onto the imaging element 220 as illustrated in FIG. 15, which is a manufacturing method of the imaging device 211 of FIG. 14, will be described with reference to FIGS. 16 to 18.

In step S51, the logic circuit 221 and the memory circuit 222 subjected to the electrical inspection and then confirmed to be non-defective products are transferred to the imaging element 220 on the wafer 101, and the wiring line 234 is formed to the terminals 220a, 221a, and 222a.

Furthermore, alignment is performed for positions at which the wiring line 234 from the terminal 221a of the logic circuit 221 and the terminal 222a of the memory circuit 222 is to appropriately face the wiring line 234 from the terminal 220a of the imaging element 220 in the wafer 101, connection is performed by CuCu bonding, and facing layers are bonded by forming the oxide film bonding layer 235 by oxide film bonding.

When the logic circuit 221 and the memory circuit 222 are transferred to the imaging element 220, the terminal 221b of the logic circuit 221 and the terminal 222b of the memory circuit 222 are placed so as to face each other.

When the logic circuit 221 is manufactured, the terminal 221b is formed together with the terminal 221a. Furthermore, when the memory circuit 222 is manufactured, the terminal 222b is formed together with the terminal 222a. For example, the terminals 221b and 222b are formed simultaneously when lower layer wiring of the logic circuit 221 and the memory circuit 222 is formed. Therefore, it is possible to manufacture without adding a plurality of steps for forming the terminals 221b and 222b.

In step S52, the protective film 241 for protection of the logic circuit 221 and the memory circuit 222 is formed. The protective film 241 is formed on three sides of the logic circuit 221 not in contact with the imaging element 220. Furthermore, the protective film 241 is formed on three sides of the memory circuit 222 not in contact with the imaging element 220. The protective film 241 can include, for example, SiN or SiO2. Furthermore, the protective film 241 may have a multilayer (laminated film) structure instead of a single layer.

In step S53, the silicon layer 103 of the logic circuit 221 and the silicon layer 104 of the memory circuit 222 are thinned. The protective film 241 is formed on the silicon layer 103 of the logic circuit 221 and the silicon layer 104 of the memory circuit 222, and is polished together at the time of thinning. At a time of removal of contamination or dust after thinning of the silicon, a part of the protective film 241 is lifted off, and a surface can be cleaned.

In step S54 (FIG. 17), there is performed processing for exposing dedicated terminals for connection of the logic circuit 221 and the memory circuit 222, that is, in this case, the terminals 221b and 222b, by using a patterning process. In step S54, in order to facilitate patterning, a predetermined material may be embedded in a gap portion between the logic circuit 221 and the memory circuit 222, and the processing for exposing may be performed after surface flatness is secured.

Figure 19:
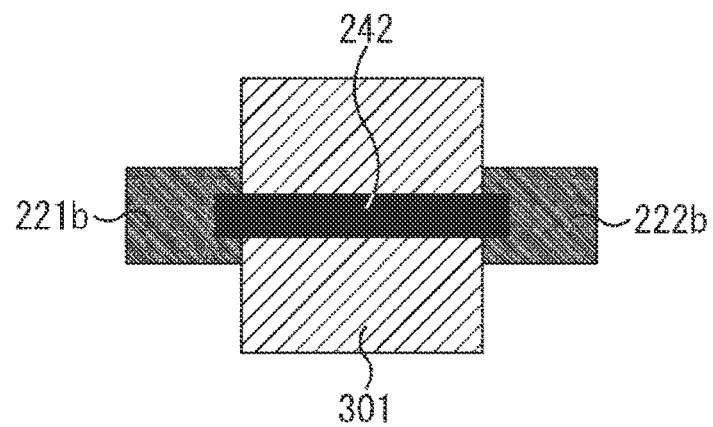
FIG. 19 is a view for explaining manufacturing of a wiring line.

In step S55, the wiring line 242 connecting the terminal 221b and the terminal 222b is formed. The wiring line 242 includes metal such as copper (Cu), tungsten (W), or aluminum (Al). The wiring line 242 is formed using resist patterning and a processing process. Alternatively, as illustrated in FIG. 19, the wiring line 252 may be formed by using a method of forming a resist 301 opened only at a portion connecting the terminal 221b and the terminal 222b, exposing to form a metal sputtered film, and lifting off the resist 301.

In step S56, the silicon layer of an upper surface portion of the logic circuit 221 and the memory circuit 222 in the figure is thinned to a height that does not affect characteristics of the device, the oxide film 233 functioning as an insulating film is formed, and a chip including the rearranged logic circuit 221 and memory circuit 222 is embedded.

In step S57 (FIG. 18), the supporting substrate 232 is bonded onto the logic circuit 221 and the memory circuit 222. At this time, a layer in which the supporting substrate 232 faces the logic circuit 221 and the memory circuit 222 is bonded by forming the oxide film bonding layer 235 by oxide film bonding.

In step S58, vertical inversion is performed such that the imaging element 220 is on the upper side, and the silicon layer, which is an upper layer of the imaging element 220 in the figure, is thinned.

In step S59, the on-chip lens and the on-chip color filter 231 are provided on the imaging element 220, and dicing into individual pieces is performed to complete the imaging device 211.

As described above, a structure can be obtained in which the logic circuit 221 and the memory circuit 222 are connected by the wiring line 242. The wiring line 242 is connected to the terminal 221b and the terminal 222b that are dedicated for connection with the wiring line 242. The terminal 221b and the terminal 222b can be formed simultaneously with the wiring layer of the lowermost layer when the logic circuit 221 and the memory circuit 222 are manufactured. That is, the terminal 221b and the terminal 222b can be formed without increasing the number of steps for forming the terminal 221b and the terminal 222b.

Furthermore, the step of forming the wiring line 242 connecting the terminals 221b and 222b does not include a step of penetrating the substrate or carving the substrate to a deep position, so that the wiring line 242 can be easily formed.

The step of forming the wiring line 242 is steps S52 to S55 in the above description. In these steps, there is no process of forming a deep trench in a silicon layer, no process of making a hole in an anti-reflection (AR) coating and embedding a metal in a case of an imaging device having an anti-reflection structure by the AR coating, no chemical mechanical polish (CMP) process of metal, or the like. Since the wiring line 242 can be formed by a manufacturing step that does not require these processes, the wiring line 242 can be easily formed.

Furthermore, by forming the protective film 241, insulation between chips can be maintained in the configuration.

The present technology is not applied only to the imaging device having the above-described configuration, but is also applicable to an imaging device having another configuration.

Furthermore, the present technology can also be applied to a device having a configuration in which a plurality of circuits (chips) is mounted on one chip. That is, the plurality of chips can be formed as a chip provided with a bulking layer or a chip not provided with a bulking layer, and can be mounted on one chip. Furthermore, in a case where a plurality of chips provided with the bulking layer is mounted on a predetermined chip, a thickness of the bulking layer can be made different for each chip.

Furthermore, by configuring a wiring line that connects the chips as the wiring line 242 described above, it is possible to obtain an advantage such as facilitation of manufacturing.

<Application Example to Electronic Device>

The imaging element described above can be applied to various electronic devices such as, for example, an imaging device such as a digital still camera and a digital video camera, a mobile phone with an imaging function, or other devices having an imaging function.

Figure 20:
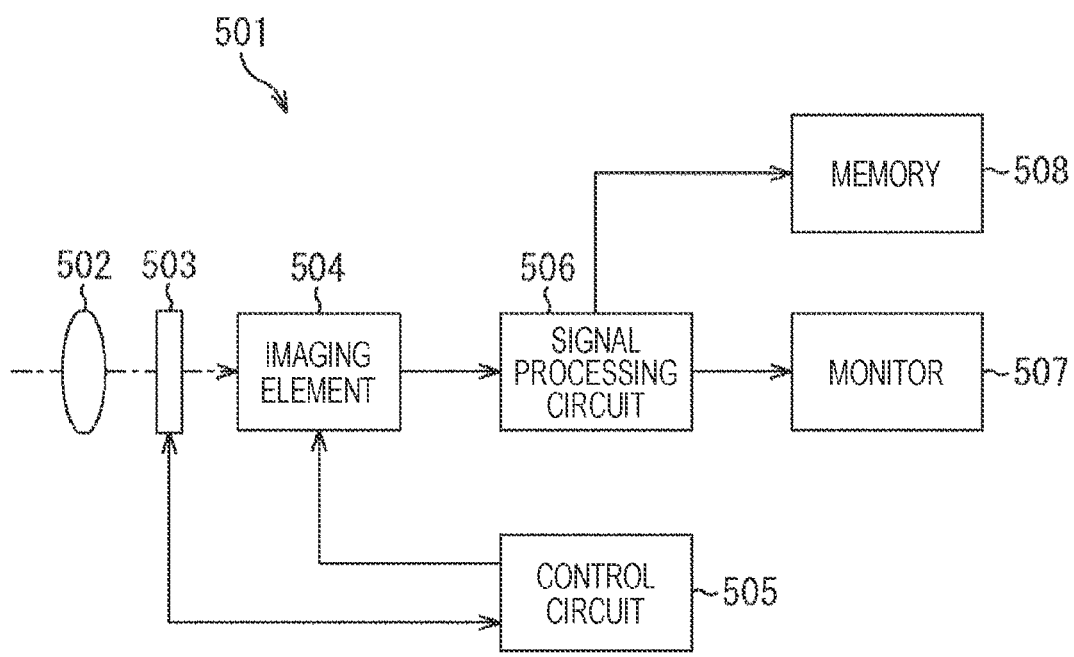
FIG. 20 is a diagram illustrating an example of an electronic device.

FIG. 20 is a block diagram showing a configuration example of an imaging device as an electronic device to which the present technology is applied.

An imaging device 501 illustrated in FIG. 20 includes an optical system 502, a shutter device 503, an imaging element 504, a drive circuit 505, a signal processing circuit 506, a monitor 507, and a memory 508, and can capture still images and moving images.

The optical system 502 has one or more lenses, and guides light (incident light) from a subject to the imaging element 504 and forms as an image on a light receiving surface of the imaging element 504.

The shutter device 503 is arranged between the optical system 502 and the imaging element 504, and controls a light irradiation period and a shading period with respect to the imaging element 504 in accordance with the control of the drive circuit 505.

The imaging element 504 includes a package including the above-described imaging element. The imaging element 504 accumulates signal charges for a certain period of time in accordance with light formed as an image on the light receiving surface via the optical system 502 and the shutter device 503. The signal charges accumulated in the imaging element 504 are transferred in accordance with a drive signal (a timing signal) supplied from the drive circuit 505.

The drive circuit 505 outputs a drive signal for controlling a transfer operation of the imaging element 504 and a shutter operation of the shutter device 503, to drive the imaging element 504 and the shutter device 503.

The signal processing circuit 506 performs various kinds of signal processing on the signal charges outputted from the imaging element 504. An image (image data) obtained by performing signal processing by the signal processing circuit 506 is supplied to the monitor 507 to be displayed, or supplied to the memory 508 to be stored (recorded).

Also in the imaging device 501 configured as described above, by applying the imaging device 111 (imaging device 211) described above to the optical system 502 and the imaging element 204, it is possible to improve a yield and reduce a manufacturing cost.

<Usage Example of Imaging Element>

The imaging element described above can be used in various cases for sensing light such as visible light, infrared light, ultraviolet light, and X-ray, as described below, for example.

- Devices to capture an image to be used for viewing, such as a digital camera or a portable device with a camera function
- Devices used for transportation, such as vehicle-mounted sensors that capture an image in front, rear, surroundings, interior, and the like of an automobile, monitoring cameras that monitor traveling vehicles and roads, and distance measurement sensors that measure a distance between vehicles, for safe driving such as automatic stop, recognition of a state of a driver, and the like
- Devices used for household electric appliances such as a TV, a refrigerator, and an air conditioner, in order to capture an image of a gesture of a user and perform an apparatus operation according to the gesture
- Devices used for medical care or health care, such as endoscopes or devices that perform angiography by receiving infrared light
- Devices used for security such as monitoring cameras for crime prevention and cameras for personal authentication
- Devices used for beauty care such as a skin measuring instrument for image capturing of the skin and a microscope for image capturing of a scalp
- Devices used for sports such as action cameras and wearable cameras for sports applications and the like
- Devices used for agriculture such as cameras for monitoring a condition of fields and crops <Application Example to Endoscopic Surgery System>

The technology (the present technology) according to the present disclosure can be applied to various products. For example, the technology according to the present disclosure may be applied to an endoscopic surgery system.

Figure 21:
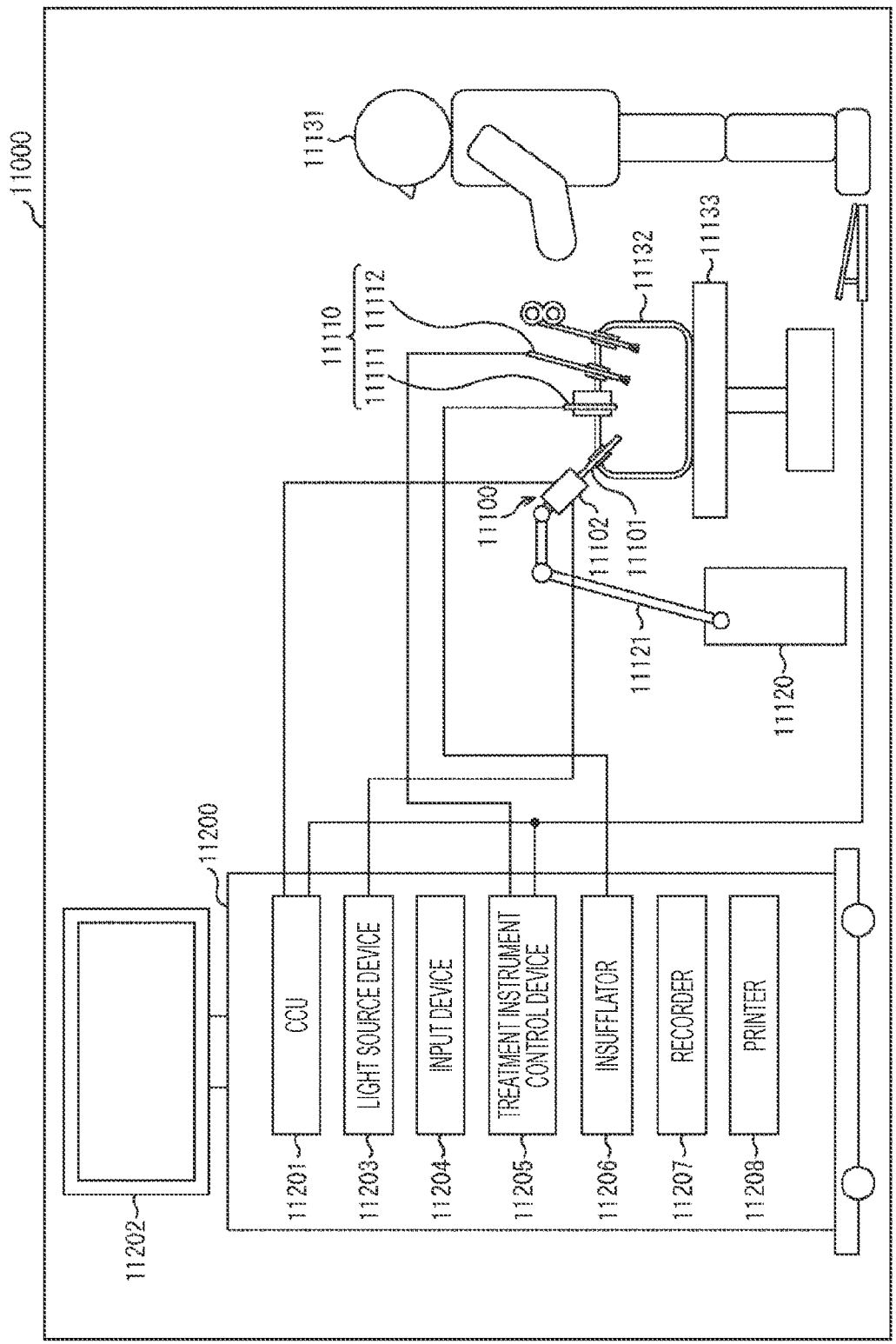
FIG. 21 is a view illustrating an example of a schematic configuration of an endoscopic surgery system.

FIG. 21 is a view illustrating an example of a schematic configuration of an endoscopic surgery system to which the technology (the present technology) according to the present disclosure can be applied.

FIG. 21 illustrates a state where an operator (a doctor) 11131 performs surgery on a patient 11132 on a patient bed 11133, by using an endoscopic surgery system 11000. As illustrated, the endoscopic surgery system 11000 includes: an endoscope 11100; other surgical instruments 11110 such as an insufflation tube 11111 and an energy treatment instrument 11112; a support arm device 11120 supporting the endoscope 11100; and a cart 11200 mounted with various devices for endoscopic surgery.

The endoscope 11100 includes a lens barrel 11101 whose region of a predetermined length from a distal end is inserted into a body cavity of the patient 11132, and a camera head 11102 connected to a proximal end of the lens barrel 11101. In the illustrated example, the endoscope 11100 configured as a so-called rigid endoscope having a rigid lens barrel 11101 is illustrated, but the endoscope 11100 may be configured as a so-called flexible endoscope having a flexible lens barrel.

At the distal end of the lens barrel 11101, an opening fitted with an objective lens is provided. The endoscope 11100 is connected with a light source device 11203, and light generated by the light source device 11203 is guided to the distal end of the lens barrel by a light guide extended inside the lens barrel 11101, and emitted toward an observation target in the body cavity of the patient 11132 through the objective lens. Note that the endoscope 11100 may be a forward-viewing endoscope, or may be an oblique-viewing endoscope or a side-viewing endoscope.

Inside the camera head 11102, an optical system and an imaging element are provided, and reflected light (observation light) from the observation target is condensed on the imaging element by the optical system. The observation light is photoelectrically converted by the imaging element, and an electric signal corresponding to the observation light, in other words, an image signal corresponding to an observation image is generated. The image signal is transmitted to a camera control unit (CCU) 11201 as RAW data.

The CCU 11201 is configured by a central processing unit (CPU), a graphics processing unit (GPU), and the like, and integrally controls action of the endoscope 11100 and a display device 11202. Moreover, the CCU 11201 receives an image signal from the camera head 11102, and applies, on the image signal, various types of image processing for displaying an image on the basis of the image signal, for example, development processing (demosaicing processing) and the like.

The display device 11202 displays an image on the basis of the image signal subjected to the image processing by the CCU 11201, under the control of the CCU 11201.

The light source device 11203 is configured by a light source such as a light emitting diode (LED), for example, and supplies irradiation light at a time of capturing an image of the operative site or the like to the endoscope 11100.

An input device 11204 is an input interface to the endoscopic surgery system 11000. A user can input various types of information and input instructions to the endoscopic surgery system 11000 via the input device 11204. For example, the user inputs an instruction or the like for changing imaging conditions (a type of irradiation light, a magnification, a focal length, and the like) by the endoscope 11100.

A treatment instrument control device 11205 controls driving of the energy treatment instrument 11112 for ablation of a tissue, incision, sealing of a blood vessel, or the like. An insufflator 11206 sends gas into a body cavity through the insufflation tube 11111 in order to inflate the body cavity of the patient 11132 for the purpose of securing a visual field by the endoscope 11100 and securing a working space of the operator. A recorder 11207 is a device capable of recording various types of information regarding the surgery. A printer 11208 is a device capable of printing various types of information regarding the surgery in various forms such as text, images, and graphs.

Note that the light source device 11203 that supplies the endoscope 11100 with irradiation light for capturing an image of the operative site may include, for example, a white light source configured by an LED, a laser light source, or a combination thereof. In a case where the white light source is configured by a combination of RGB laser light sources, since output intensity and output timing of each color (each wavelength) can be controlled with high precision, the light source device 11203 can adjust white balance of a captured image. Furthermore, in this case, it is also possible to capture an image corresponding to each of RGB in a time division manner by irradiating the observation target with laser light from each of the RGB laser light sources in a time-division manner, and controlling driving of the imaging element of the camera head 11102 in synchronization with the irradiation timing. According to this method, it is possible to obtain a color image without providing a color filter in the imaging element.

Furthermore, driving of the light source device 11203 may be controlled to change intensity of the light to be outputted at every predetermined time interval. By acquiring images in a time-division manner by controlling the driving of the imaging element of the camera head 11102 in synchronization with the timing of the change of the light intensity, and combining the images, it is possible to generate an image of a high dynamic range without so-called black defects and whiteout.

Furthermore, the light source device 11203 may be configured to be able to supply light having a predetermined wavelength band corresponding to special light observation. In the special light observation, for example, so-called narrow band imaging is performed in which predetermined tissues such as blood vessels in a mucous membrane surface layer are imaged with high contrast by utilizing wavelength dependency of light absorption in body tissues and irradiating the predetermined tissues with narrow band light as compared to the irradiation light (in other words, white light) at the time of normal observation. Alternatively, in the special light observation, fluorescence observation for obtaining an image by fluorescence generated by irradiation of excitation light may be performed. In the fluorescence observation, it is possible to perform irradiating a body tissue with excitation light and observing fluorescence from the body tissue (autofluorescence observation), locally injecting a reagent such as indocyanine green (ICG) into a body tissue and irradiating the body tissue with excitation light corresponding to the fluorescence wavelength of the reagent to obtain a fluorescent image, or the like. The light source device 11203 may be configured to be able to supply narrow band light and/or excitation light corresponding to such special light observation.

Figure 22:
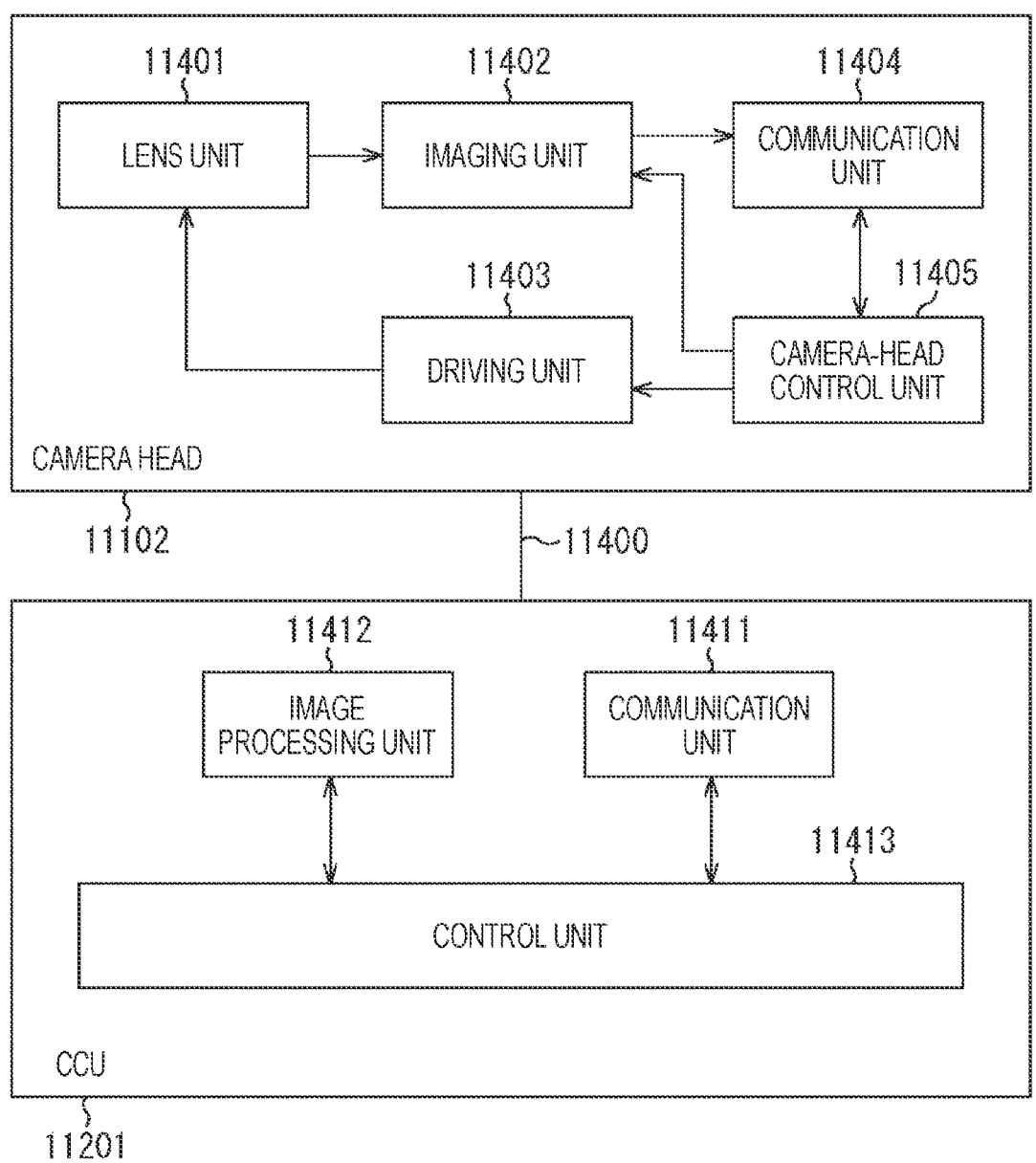
FIG. 22 is a block diagram illustrating an example of a functional configuration of a camera head and a CCU.

FIG. 22 is a block diagram illustrating an example of a functional configuration of the camera head 11102 and the CCU 11201 illustrated in FIG. 21.

The camera head 11102 has a lens unit 11401, an imaging unit 11402, a driving unit 11403, a communication unit 11404, and a camera-head control unit 11405. The CCU 11201 has a communication unit 11411, an image processing unit 11412, and a control unit 11413. The camera head 11102 and the CCU 11201 are communicably connected in both directions by a transmission cable 11400.

The lens unit 11401 is an optical system provided at a connection part with the lens barrel 11101. Observation light taken in from the distal end of the lens barrel 11101 is guided to the camera head 11102 and is incident on the lens unit 11401. The lens unit 11401 is configured by combining a plurality of lenses including a zoom lens and a focus lens.

The number of the imaging elements included in the imaging unit 11402 may be one (a so-called single plate type) or plural (a so-called multi-plate type). In a case where the imaging unit 11402 is configured with the multi-plate type, for example, individual imaging elements may generate image signals corresponding to RGB each, and a color image may be obtained by synthesizing them. Alternatively, the imaging unit 11402 may have a pair of imaging elements for respectively acquiring image signals for the right eye and the left eye corresponding to three-dimensional (3D) display. Performing 3D display enables the operator 11131 to more accurately grasp a depth of living tissues in the operative site. Note that, in a case where the imaging unit 11402 is configured as the multi-plate type, a plurality of systems of the lens unit 11401 may also be provided corresponding to individual imaging elements.

Furthermore, the imaging unit 11402 may not necessarily be provided in the camera head 11102. For example, the imaging unit 11402 may be provided inside the lens barrel 11101 immediately after the objective lens.

The driving unit 11403 is configured by an actuator, and moves the zoom lens and the focus lens of the lens unit 11401 along an optical axis by a predetermined distance under control from the camera-head control unit 11405. With this configuration, a magnification and focus of a captured image by the imaging unit 11402 may be appropriately adjusted.

The communication unit 11404 is configured by a communication device for exchange of various types of information between with the CCU 11201. The communication unit 11404 transmits an image signal obtained from the imaging unit 11402 to the CCU 11201 via the transmission cable 11400 as RAW data.

Furthermore, the communication unit 11404 receives a control signal for controlling driving of the camera head 11102 from the CCU 11201, and supplies to the camera-head control unit 11405. The control signal includes information regarding imaging conditions such as, for example, information of specifying a frame rate of a captured image, information of specifying an exposure value at the time of imaging, information of specifying a magnification and focus of a captured image, and/or the like.

Note that the imaging conditions described above such as a frame rate, an exposure value, magnification, and focus may be appropriately specified by the user, or may be automatically set by the control unit 11413 of the CCU 11201 on the basis of the acquired image signal. In the latter case, a so-called auto exposure (AE) function, auto focus (AF) function, and auto white balance (AWB) function are to be installed in the endoscope 11100.

The camera-head control unit 11405 controls driving of the camera head 11102 on the basis of the control signal from the CCU 11201 received via the communication unit 11404.

The communication unit 11411 is configured by a communication device for exchange of various types of information with the camera head 11102. The communication unit 11411 receives an image signal transmitted via the transmission cable 11400 from the camera head 11102.

Furthermore, the communication unit 11411 transmits, to the camera head 11102, a control signal for controlling driving of the camera head 11102. Image signals and control signals can be transmitted by telecommunication, optical communication, or the like.

The image processing unit 11412 performs various types of image processing on an image signal that is RAW data transmitted from the camera head 11102.

The control unit 11413 performs various types of control related to imaging of an operative site and the like by the endoscope 11100 and related to display of a captured image obtained by the imaging of the operative site and the like. For example, the control unit 11413 generates a control signal for controlling driving of the camera head 11102.

Furthermore, the control unit 11413 causes the display device 11202 to display a captured image in which the operative site or the like is shown, on the basis of the image signal subjected to the image processing by the image processing unit 11412. At this time, the control unit 11413 recognizes various objects in the captured image by using various image recognition techniques. For example, by detecting a shape, a color, and the like of an edge of the object included in the captured image, the control unit 11413 can recognize a surgical instrument such as forceps, a specific living site, bleeding, mist in using the energy treatment instrument 11112, and the like. When causing the display device 11202 to display the captured image, the control unit 11413 may use the recognition result to superimpose and display various types of surgery support information on the image of the operative site. By superimposing and displaying the surgical support information and presenting to the operator 11131, it becomes possible to reduce a burden on the operator 11131 and to allow the operator 11131 to reliably proceed with the surgery.

The transmission cable 11400 connecting the camera head 11102 and the CCU 11201 is an electric signal cable corresponding to communication of an electric signal, an optical fiber corresponding to optical communication, or a composite cable of these.

Here, in the illustrated example, communication is performed by wire communication using the transmission cable 11400, but communication between the camera head 11102 and the CCU 11201 may be performed wirelessly.

<Application Example to Mobile Object>

The technology (the present technology) according to the present disclosure can be applied to various products. For example, the technology according to the present disclosure may be realized as a device equipped on any type of mobile objects, such as an automobile, an electric car, a hybrid electric car, a motorcycle, a bicycle, personal mobility, an airplane, a drone, a ship, a robot, and the like.

Figure 23:
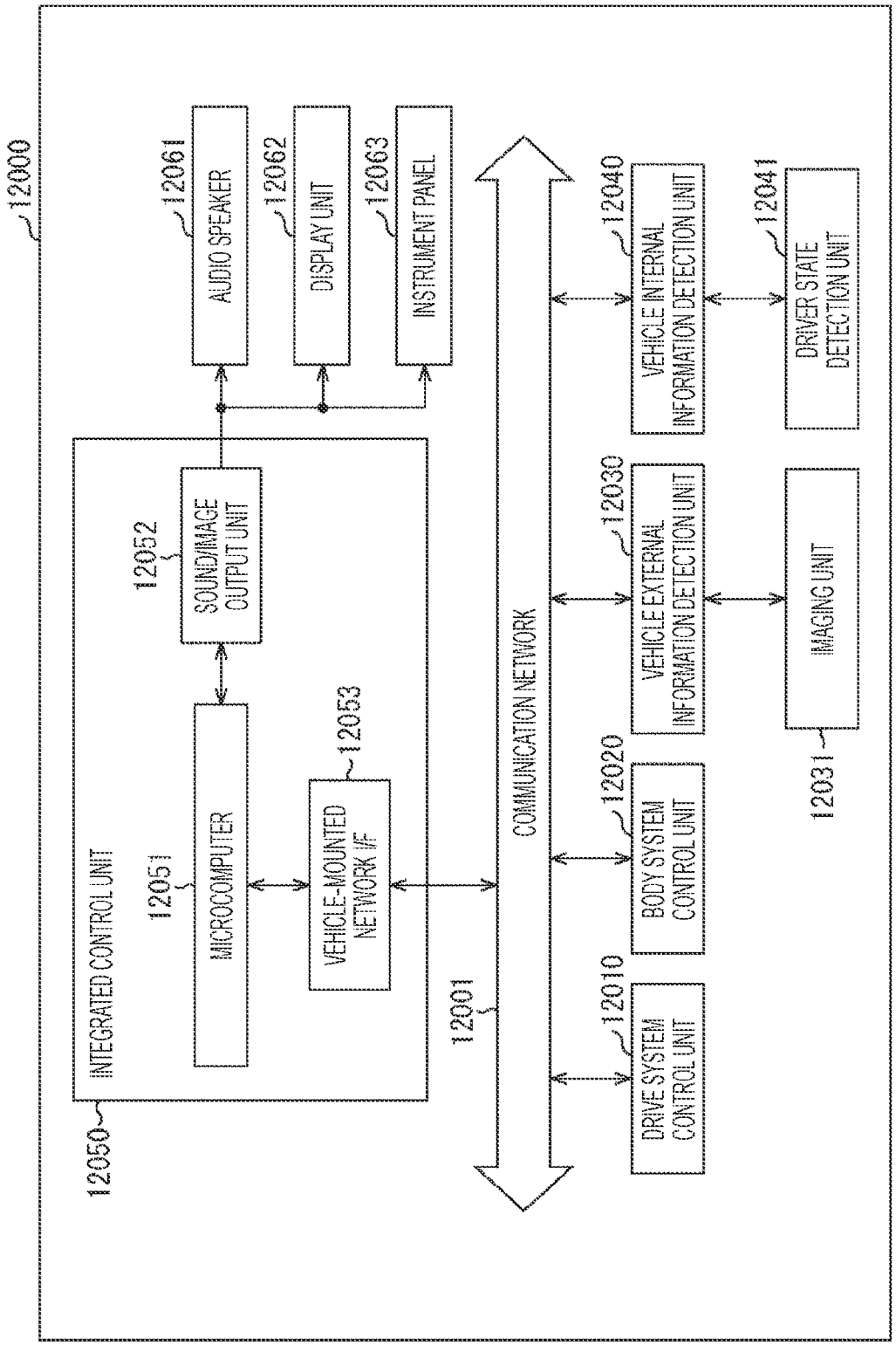
FIG. 23 is a block diagram illustrating an example of a schematic configuration of a vehicle control system.

FIG. 23 is a block diagram illustrating a schematic configuration example of a vehicle control system, which is an example of a mobile object control system to which the technology according to the present disclosure may be applied.

A vehicle control system 12000 includes a plurality of electronic control units connected via a communication network 12001. In the example illustrated in FIG. 23, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, a sound/image output unit 12052, and a vehicle-mounted network interface (I/F) 12053 are illustrated.

The drive system control unit 12010 controls an operation of devices related to a drive system of a vehicle in accordance with various programs. For example, the drive system control unit 12010 functions as: a driving force generation device for generation of a driving force of the vehicle such as an internal combustion engine or a drive motor; a driving force transmission mechanism for transmission of a driving force to wheels; a steering mechanism to adjust a steering angle of the vehicle; and a control device such as a braking device that generates a braking force of the vehicle.

The body system control unit 12020 controls an operation of various devices mounted on a vehicle body in accordance with various programs. For example, the body system control unit 12020 functions as a control device for a keyless entry system, a smart key system, a power window device, or various lamps such as a headlamp, a back lamp, a brake lamp, a turn indicator, or a fog lamp. In this case, the body system control unit 12020 may be inputted with radio waves or signals of various switches transmitted from a portable device that substitutes for a key. The body system control unit 12020 receives an input of these radio waves or signals, and controls a door lock device, a power window device, a lamp, and the like of the vehicle.

The vehicle external information detection unit 12030 detects information about an outside of the vehicle equipped with the vehicle control system 12000. For example, to the vehicle external information detection unit 12030, an imaging unit 12031 is connected. The vehicle external information detection unit 12030 causes the imaging unit 12031 to capture an image of an outside of the vehicle, and receives the captured image. The vehicle external information detection unit 12030 may perform an object detection process or a distance detection process for a person, a vehicle, an obstacle, a sign, a character on a road surface, or the like on the basis of the received image.

The imaging unit 12031 is an optical sensor that receives light and outputs an electric signal according to an amount of received light. The imaging unit 12031 can output the electric signal as an image, or can output as distance measurement information. Furthermore, the light received by the imaging unit 12031 may be visible light or non-visible light such as infrared light.

The vehicle internal information detection unit 12040 detects information inside the vehicle. The vehicle internal information detection unit 12040 is connected with, for example, a driver state detection unit 12041 that detects a state of a driver. The driver state detection unit 12041 may include, for example, a camera that images the driver, and, on the basis of detection information inputted from the driver state detection unit 12041, the vehicle internal information detection unit 12040 may calculate a degree of tiredness or a degree of concentration of the driver, or may determine whether or not the driver is asleep.

On the basis of information inside and outside the vehicle acquired by the vehicle external information detection unit 12030 or the vehicle internal information detection unit 12040, the microcomputer 12051 can operate a control target value of the driving force generation device, the steering mechanism, or the braking device, and output a control command to the drive system control unit 12010. For example, the microcomputer 12051 can perform cooperative control for the purpose of realizing functions of advanced driver assistance system (ADAS) including avoidance of collisions or mitigation of impacts of the vehicle, follow-up traveling on the basis of an inter-vehicle distance, vehicle speed maintenance traveling, vehicle collision warning, vehicle lane departure warning, and the like.

Furthermore, by controlling the driving force generation device, the steering mechanism, the braking device, or the like on the basis of the information about surroundings of the vehicle acquired by the vehicle external information detection unit 12030 or the vehicle internal information detection unit 12040, the microcomputer 12051 may perform cooperative control for the purpose of, for example, automatic driving for autonomously traveling without depending on an operation of the driver.

Furthermore, the microcomputer 12051 can output a control command to the body system control unit 12030 on the basis of information about the outside of the vehicle acquired by the vehicle external information detection unit 12030. For example, the microcomputer 12051 can control a headlamp in accordance with a position of a preceding vehicle or an oncoming vehicle detected by the vehicle external information detection unit 12030, and perform cooperative control for the purpose of antiglare, such as switching a high beam to a low beam.

The sound/image output unit 12052 transmits an output signal of at least one of sound or an image, to an output device capable of visually or audibly notifying, of information, a passenger of the vehicle or outside the vehicle. In the example of FIG. 23, an audio speaker 12061, a display unit 12062, and an instrument panel 12063 are exemplified as the output devices. The display unit 12062 may include, for example, at least one of an on-board display or a head-up display.

Figure 24:
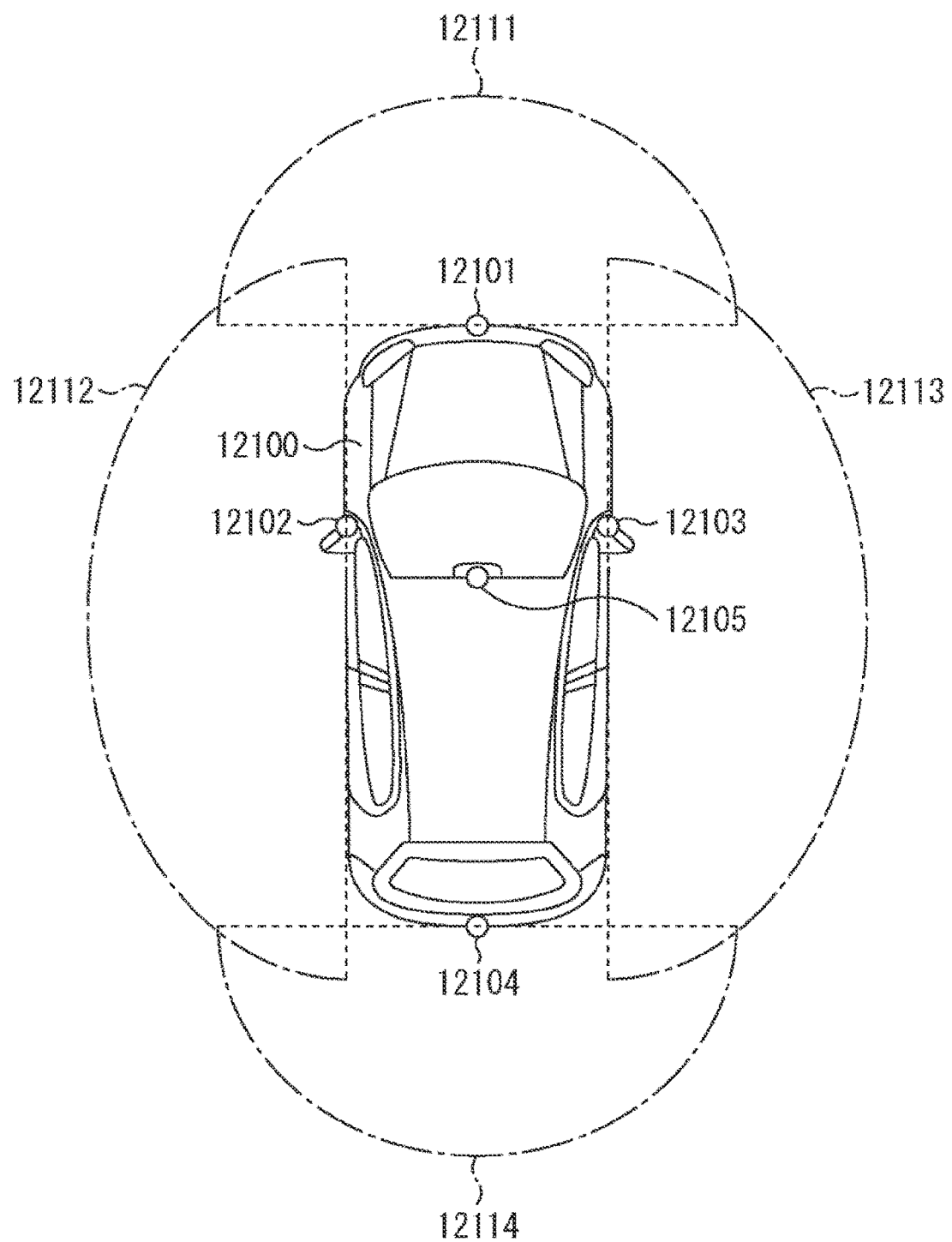
FIG. 24 is an explanatory view illustrating an example of an installation position of a vehicle external information detection unit and an imaging unit.

FIG. 24 is a view illustrating an example of an installation position of the imaging unit 12031.

In FIG. 24, as the imaging unit 12031, imaging units 12101, 12102, 12103, 12104, and 12105 are provided.

The imaging units 12101, 12102, 12103, 12104, and 12105 are provided at, for example, a front nose, side mirrors, a rear bumper, a back door, an upper part of a windshield in a vehicle cabin, or the like of a vehicle 12100. The imaging unit 12101 provided at the front nose and the imaging unit 12105 provided at the upper part of the windshield in the vehicle cabin mainly acquire an image in front of the vehicle 12100. The imaging units 12102 and 12103 provided at the side mirrors mainly acquire an image of a side of the vehicle 12100. The imaging unit 12104 provided at the rear bumper or the back door mainly acquires an image behind the vehicle 12100. The imaging unit 12105 provided at the upper part of the windshield in the vehicle cabin is mainly used for detection of a preceding vehicle, or a pedestrian, an obstacle, a traffic light, a traffic sign, a lane, or the like.

Note that FIG. 24 shows an example of an image capturing range of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 each provided at the side mirrors, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements, or an imaging element having pixels for detecting a phase difference.

For example, on the basis of the distance information obtained from the imaging units 12101 to 12104, by obtaining a distance to each solid object within the imaging ranges 12111 to 12114 and a time change of this distance (a relative speed with respect to the vehicle 12100), the microcomputer 12051 can extract, as a preceding vehicle, especially a solid object that is the closest on a travel route of the vehicle 12100, and that is traveling at a predetermined speed (for example, 0 km/h or more) in substantially the same direction as the vehicle 12100. Moreover, the microcomputer 12051 can set an inter-vehicle distance to be secured from a preceding vehicle in advance, and perform automatic brake control (including follow-up stop control), automatic acceleration control (including follow-up start control), and the like. In this way, it is possible to perform cooperative control for the purpose of, for example, automatic driving for autonomously traveling without depending on an operation of the driver.

For example, on the basis of the distance information obtained from the imaging units 12101 to 12104, the microcomputer 12051 can classify solid object data regarding solid objects into a two-wheeled vehicle, an ordinary vehicle, a large vehicle, a pedestrian, a utility pole, and the like, to extract and use for automatic avoidance of obstacles. For example, the microcomputer 12051 distinguishes obstacles around the vehicle 12100 into obstacles that are visible to the driver of the vehicle 12100 and obstacles that are difficult to see. Then, the microcomputer 12051 can determine a collision risk indicating a risk of collision with each obstacle, and provide driving assistance for collision avoidance by outputting an alarm to the driver via the audio speaker 12061 or the display unit 12062, or by performing forced deceleration and avoidance steering via the drive system control unit 12010, when the collision risk is equal to or larger than a set value and there is a possibility of collision.

At least one of the imaging units 12101 to 12104 may be an infrared camera that detects infrared light. For example, the microcomputer 12051 can recognize a pedestrian by determining whether or not a pedestrian exists in a captured image of the imaging units 12101 to 12104. Such recognition of a pedestrian is performed by, for example, a procedure of extracting a feature point in a captured image of the imaging unit 12101 to 12104 as an infrared camera, and a procedure of performing pattern matching processing on a series of feature points indicating a contour of an object and determining whether or not the object is a pedestrian. When the microcomputer 12051 determines that a pedestrian is present in the image captured by the imaging units 12101 to 12104 and recognizes the pedestrian, the sound/image output unit 12052 controls the display unit 12062 so as to superimpose and display a rectangular contour line for emphasis on the recognized pedestrian. Furthermore, the sound/image output unit 12052 may control the display unit 12062 to display an icon or the like indicating a pedestrian at a desired position.

Furthermore, in the present specification, the system represents the entire device including a plurality of devices.

Note that the effects described in this specification are merely examples and are not limited, and other effects may also be present.

Note that the embodiment of the present technology is not limited to the above-described embodiment, and various modifications can be made without departing from the scope of the present technology.

Note that the present technology can also have the following configurations.

(1)
An imaging device including:
a first semiconductor element including an imaging element configured to generate a pixel signal; and
a second semiconductor element in which a first signal processing circuit and a second signal processing circuit that are configured to process the pixel signal are embedded by an embedded member, in which
the first signal processing circuit has a structure including at least one more layer than the second signal processing circuit.

(2)
The imaging device according to (1) described above, further including:
a first wiring line that connects the first semiconductor element and the first signal processing circuit.

(3)
The imaging device according to (2) described above, further including:
a second wiring line that connects the first signal processing circuit and the second signal processing circuit.

(4)
The imaging device according to (3) described above, in which
the first wiring line connects a terminal of the first semiconductor element and a first terminal of the first signal processing circuit, and
the second wiring line connects a second terminal of the first signal processing circuit and a third terminal of the second signal processing circuit, the second terminal being different from the first terminal.

(5)
The imaging device according to any one of (1) to (4) described above, in which
the layer is an oxide film.

(6)
The imaging device according to any one of (1) to (5) described above, in which
a distance between a terminal of the first semiconductor element and a terminal of the first signal processing circuit is shorter than a distance between a terminal of the first semiconductor element and a terminal of the second signal processing circuit.

(7)
The imaging device according to any one of (1) to (6) described above, in which
the first signal processing circuit is a memory circuit, and the second signal processing circuit is a logic circuit.

(8)
An electronic device including an imaging device including:
a first semiconductor element including an imaging element configured to generate a pixel signal; and
a second semiconductor element in which a first signal processing circuit and a second signal processing circuit that are configured to process the pixel signal are embedded by an embedded member, in which
the first signal processing circuit has a structure including at least one more layer than the second signal processing circuit.

(9)
An imaging device including:
a first semiconductor element including an imaging element configured to generate a pixel signal;
a second semiconductor element in which a first signal processing circuit and a second signal processing circuit that are configured to process the pixel signal are embedded by an embedded member; and
a wiring line that connects the first signal processing circuit and the second signal processing circuit, in which
the wiring line connects a terminal provided in a wiring layer of a lowermost layer of the first signal processing circuit and a terminal provided in a wiring layer of a lowermost layer of the second signal processing circuit.

(10)
The imaging device according to (9) described above, in which
the wiring line is provided along a side surface of the first signal processing circuit and a side surface of the second signal processing circuit.

(11)
The imaging device according to (10) described above, in which
a part of the wiring line is provided along a layer formed on a bonding surface between the first semiconductor element and the second semiconductor element.

(12)
The imaging device according to (9) or (11) described above, in which
at least one or more layers are provided between the wiring line and the first signal processing circuit and between the wiring line and the second signal processing circuit.

(13)
The imaging device according to (12) described above, in which
the one or more layers are insulating films.

(14)

An electronic device including an imaging device including:
- a first semiconductor element including an imaging element configured to generate a pixel signal;
- a second semiconductor element in which a first signal processing circuit and a second signal processing circuit that are configured to process the pixel signal are embedded by an embedded member; and
- a wiring line that connects the first signal processing circuit and the second signal processing circuit, in which
- the wiring line connects a terminal provided in a wiring layer of a lowermost layer of the first signal processing circuit and a terminal provided in a wiring layer of a lowermost layer of the second signal processing circuit.

(15)

A manufacturing method for manufacturing an imaging device including:
- a first semiconductor element including an imaging element configured to generate a pixel signal on a pixel basis;
- a second semiconductor element in which a first signal processing circuit and a second signal processing circuit that are configured to process the pixel signal are embedded by an embedded member; and
- a wiring line that connects the first signal processing circuit and the second signal processing circuit, the manufacturing method including:
- a step of transferring the first signal processing circuit and the second signal processing circuit to the first semiconductor element;
- a step of forming a first film on the first signal processing circuit and the second signal processing circuit;
- a step of exposing a part of a first terminal provided in a wiring layer of a lowermost layer of the first signal processing circuit and a part of a second terminal provided in a wiring layer of a lowermost layer of the second signal processing circuit; and
- a step of forming the wiring line that connects the first terminal and the second terminal.

(16)

The manufacturing method according to (15) described above, further including:
- a step of, after forming the first film, thinning the first signal processing circuit and the second signal processing circuit.

REFERENCE SIGNS LIST

101 Wafer
102 Supporting substrate
103 Wafer
104 Wafer
111 Imaging device
120 Imaging element
121 Logic circuit
122 Memory circuit
131 On-chip color filter
132 Supporting substrate
133 Oxide film
134 Wiring line
135 Oxide film bonding layer
136 Wiring line
137 Bulking layer
151 Dicing tape
152 Ring frame
153 Dicing tape
154 Ring frame
162 Supporting substrate
201 Wiring line
204 Imaging element
211 Imaging device
220 Imaging element
221 Logic circuit
222 Memory circuit
231 On-chip color filter
232 Supporting substrate
233 Oxide film
234 Wiring line
235 Oxide film bonding layer
241 Protective film
242 Wiring line
252 Wiring line
301 Resist

What is claimed is:

1. An imaging device, comprising:
a first semiconductor element including an imaging element configured to generate a pixel signal; and
a second semiconductor element in which a first signal processing circuit and a second signal processing circuit that are configured to process the pixel signal are embedded by an embedded member,
wherein the first signal processing circuit has a structure including at least one more layer than the second signal processing circuit, and
wherein a size of the second semiconductor element is larger than a size of the first semiconductor element in a plan view.

2. The imaging device according to claim 1, further comprising a first wiring line that connects the first semiconductor element and the first signal processing circuit.

3. The imaging device according to claim 2, further comprising a second wiring line that connects the first signal processing circuit and the second signal processing circuit.

4. The imaging device according to claim 3,
wherein the first wiring line connects a terminal of the first semiconductor element and a first terminal of the first signal processing circuit, and
wherein the second wiring line connects a second terminal of the first signal processing circuit and a third terminal of the second signal processing circuit, the second terminal being different from the first terminal.

5. The imaging device according to claim 1, wherein the layer is an oxide film.

6. The imaging device according to claim 1, wherein a distance between a terminal of the first semiconductor element and a terminal of the first signal processing circuit is shorter than a distance between a terminal of the first semiconductor element and a terminal of the second signal processing circuit.

7. The imaging device according to claim 1, wherein the first signal processing circuit is a memory circuit, and the second signal processing circuit is a logic circuit.

8. An electronic device including an imaging device, comprising:
a first semiconductor element including an imaging element configured to generate a pixel signal; and
a second semiconductor element in which a first signal processing circuit and a second signal processing circuit that are configured to process the pixel signal are embedded by an embedded member, wherein the first signal processing circuit has a structure including at least one more layer than the second signal processing circuit, and wherein a size of the second semiconductor element is larger than a size of the first semiconductor element in a plan view.

9. The electronic device according to claim 8, further comprising a first wiring line that connects the first semiconductor element and the first signal processing circuit.

10. The electronic device according to claim 8, wherein the layer is an oxide film.

11. The electronic device according to claim 8, wherein a distance between a terminal of the first semiconductor element and a terminal of the first signal processing circuit is shorter than a distance between a terminal of the first semiconductor element and a terminal of the second signal processing circuit.

12. The electronic device according to claim 8, wherein the first signal processing circuit is a memory circuit, and the second signal processing circuit is a logic circuit.

13. An imaging device, comprising:
   a first semiconductor element including an imaging element configured to generate a pixel signal;
   a second semiconductor element in which a first signal processing circuit and a second signal processing circuit that are configured to process the pixel signal are embedded by an embedded member; and
   a wiring line that connects the first signal processing circuit and the second signal processing circuit,
   wherein the wiring line connects a terminal provided in a wiring layer of a lowermost layer of the first signal processing circuit and a terminal provided in a wiring layer of a lowermost layer of the second signal processing circuit, and
   wherein a size of the second semiconductor element is larger than a size of the first semiconductor element in a plan view.

14. The imaging device according to claim 13, wherein the wiring line is provided along a side surface of the first signal processing circuit and a side surface of the second signal processing circuit.

15. The imaging device according to claim 14, wherein a part of the wiring line is provided along a layer formed on a bonding surface between the first semiconductor element and the second semiconductor element.

16. The imaging device according to claim 13, wherein at least one or more layers are provided between the wiring line and the first signal processing circuit and between the wiring line and the second signal processing circuit.

17. The imaging device according to claim 16, wherein the one or more layers are insulating films.

18. An electronic device including an imaging device, comprising:
   a first semiconductor element including an imaging element configured to generate a pixel signal;
   a second semiconductor element in which a first signal processing circuit and a second signal processing circuit that are configured to process the pixel signal are embedded by an embedded member; and
   a wiring line that connects the first signal processing circuit and the second signal processing circuit,
   wherein the wiring line connects a terminal provided in a wiring layer of a lowermost layer of the first signal processing circuit and a terminal provided in a wiring layer of a lowermost layer of the second signal processing circuit, and
   wherein a size of the second semiconductor element is larger than a size of the first semiconductor element in a plan view.

19. A manufacturing method, comprising:
   a step of transferring a first signal processing circuit and a second signal processing circuit to a first semiconductor element;
   a step of forming a first film on the first signal processing circuit and the second signal processing circuit;
   a step of exposing a part of a first terminal provided in a wiring layer of a lowermost layer of the first signal processing circuit and a part of a second terminal provided in a wiring layer of a lowermost layer of the second signal processing circuit; and
   a step of forming a wiring line that connects the first terminal and the second terminal,
   wherein a size of the second signal processing circuit is larger than a size of the first signal processing circuit in a plan view.

20. The manufacturing method according to claim 19, wherein after forming the first film, thinning the first signal processing circuit and the second signal processing circuit.

\* \* \* \* \*